(12) United States Patent
Song et al.

(10) Patent No.: US 9,954,057 B2
(45) Date of Patent: Apr. 24, 2018

(54) SEMICONDUCTOR DEVICE AND METHOD OF MANUFACTURING THE SAME

(71) Applicant: SAMSUNG ELECTRONICS CO., LTD., Suwon-si, Gyeonggi-do (KR)

(72) Inventors: Kwan-Jae Song, Seoul (KR); Jae-Hyun Yoo, Suwon-si (KR); In-Hack Lee, Suwon-si (KR); Seong-Hun Jang, Suwon-si (KR); Myoung-Kyu Park, Yongin-si (KR); Young-Mok Kim, Suwon-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/424,406

(22) Filed: Feb. 3, 2017

(65) Prior Publication Data
US 2017/0236897 A1    Aug. 17, 2017

(30) Foreign Application Priority Data
Feb. 12, 2016    (KR) .................. 10-2016-0016349

(51) Int. Cl.
| H01L 21/00 | (2006.01) |
| H01L 29/06 | (2006.01) |
| H01L 21/266 | (2006.01) |
| H01L 21/308 | (2006.01) |
| H01L 21/762 | (2006.01) |
| H01L 29/10 | (2006.01) |
| H01L 29/78 | (2006.01) |

(Continued)

(52) U.S. Cl.
CPC ........ H01L 29/0649 (2013.01); H01L 21/266 (2013.01); H01L 21/308 (2013.01); H01L 21/7624 (2013.01); H01L 29/1033 (2013.01); H01L 29/1083 (2013.01); H01L 29/165 (2013.01); H01L 29/7833 (2013.01); H01L 29/0847 (2013.01)

(58) Field of Classification Search
CPC . H01L 29/0649; H01L 21/266; H01L 21/308; H01L 21/7624; H01L 29/0847; H01L 29/1083
See application file for complete search history.

(56) References Cited

U.S. PATENT DOCUMENTS 5,386,134 A * 1/1995 Huang ................ H01L 27/0266
                                                    257/344
6,004,849 A * 12/1999 Gardner ............ H01L 21/28114
                                                    257/E21.205

(Continued)

*Primary Examiner* — Nicholas Tobergte
(74) *Attorney, Agent, or Firm* — F. Chau & Associates, LLC

(57) ABSTRACT

A semiconductor device having a high and stable operating voltage and a method of manufacturing the same, the semiconductor device including: a substrate having an active region including a channel region; a gate insulating layer that covers a top surface of the active region; a gate electrode that covers the gate insulating layer on the top surface of the active region; buried insulating patterns in the channel region of the active region at a lower side of the gate electrode and spaced apart from a top surface of the substrate; and a pair of source/drain regions in the substrate at both sides of each of the buried insulating patterns and extending from the top surface of the substrate to a level lower than that of each of the buried insulating patterns.

21 Claims, 34 Drawing Sheets

(51) Int. Cl.
*H01L 29/165* (2006.01)
*H01L 29/08* (2006.01)

(56) References Cited

U.S. PATENT DOCUMENTS

| | | | |
|---|---|---|---|
| 6,407,427 B1 | 6/2002 | Oh | |
| 6,429,054 B1 * | 8/2002 | Krishnan | H01L 21/26506 |
| | | | 257/E21.335 |
| 6,461,903 B2 | 10/2002 | Lee | |
| 7,214,987 B2 | 5/2007 | Oh et al. | |
| 7,321,144 B2 * | 1/2008 | Oh | H01L 27/10873 |
| | | | 257/296 |
| 7,435,639 B2 | 10/2008 | Winstead et al. | |
| 7,476,942 B2 | 1/2009 | Watanabe et al. | |
| 7,939,395 B2 | 5/2011 | Abadeer et al. | |
| 8,575,698 B2 | 11/2013 | Cheng et al. | |
| 2005/0040464 A1 * | 2/2005 | Miura | H01L 21/84 |
| | | | 257/347 |
| 2007/0096148 A1 * | 5/2007 | Hoentschel | H01L 21/84 |
| | | | 257/192 |
| 2008/0121994 A1 * | 5/2008 | Dyer | H01L 29/66772 |
| | | | 257/347 |

\* cited by examiner

SEMICONDUCTOR DEVICE AND METHOD OF MANUFACTURING THE SAME

CROSS-REFERENCE TO RELATED APPLICATION

This application claims the benefit under 35 U.S.C. § 119 of Korean Patent Application No. 10-2016-0016349, filed on Feb. 12, 2016, in the Korean Intellectual Property Office, the disclosure of which is incorporated by reference herein in its entirety.

TECHNICAL FIELD

The inventive concept relates to a semiconductor device and a method of manufacturing the same, and more particularly, to a semiconductor device having a relatively high operating voltage and a method of manufacturing the same.

DISCUSSION OF RELATED ART

Recently, with the rapid development of the electronic industry, users' demand for smaller and higher-performance electronic devices has increased dramatically. While the industry has technologies being optimized for higher speed and lower power consumption, there are applications which require electronic devices having high-voltage capabilities. Thus, research into making semiconductor devices (integrated circuits (ICs)) having high operating voltages without using additional discrete devices for generating high operating voltages has been carried out.

SUMMARY

The inventive concept provides a semiconductor device that may have a high and stable operating voltage and a method of manufacturing the same.

According to an aspect of the inventive concept, a semiconductor device includes: a substrate having an active region including a channel region; a gate insulating layer that covers a top surface of the active region; a gate electrode that covers the gate insulating layer on the top surface of the active region; buried insulating patterns in the channel region of the active region at a lower side of the gate electrode and spaced apart from a top surface of the substrate; and a pair of source/drain regions in the substrate at both sides of each of the buried insulating patterns and extending from the top surface of the substrate to a level lower than that of each of the buried insulating patterns.

According to another aspect of the inventive concept, there is provided a semiconductor device including: a substrate including a first region, a second region, and an isolation layer, the isolation layer defining an active region including a channel region; a gate insulating layer that covers a top surface of the active region in each of the first region and the second region; a gate electrode that covers the gate insulating layer on the top surface of the active region in each of the first region and the second region; buried insulating patterns in the channel region of the active region at a lower side of the gate electrode and spaced apart from a top surface of the substrate in the second region; a pair of first source/drain regions in the substrate at both sides of the gate electrode in the first region; and a pair of second source/drain regions in the substrate at both sides of each of the buried insulating patterns and extending from the top surface of the substrate to a level lower than that of each of the buried insulating patterns in the second region, wherein, in the first region, the active region extends from the top surface of the substrate to a bottom surface of the isolation layer.

According to still another aspect of the inventive concept, a method of manufacturing a semiconductor device, includes: preparing a substrate including a substrate base layer, a buried insulating layer that covers the substrate base layer, and a semiconductor layer that covers the buried insulating layer; forming a mask layer that exposes a part of the semiconductor layer on the substrate; removing, by using the mask layer as an etching mask, a part of the exposed semiconductor layer and a part of the buried insulating layer that is lower than the semiconductor layer and forming a recess space in which a part of the substrate base layer is exposed; forming an epitaxial semiconductor layer for filling the recess space; and forming a first source/drain region in a part of the substrate using the mask layer as an implantation mask.

According to still another aspect of the inventive concept, there is provided a semiconductor device including: a substrate that includes an active region having a channel region; a gate structure on the substrate covering a top surface of the active region; a source region and a drain region in the substrate at opposite sides of the gate structure; and a buried insulating pattern in the channel region of the active region at a lower side of the gate structure and spaced apart from a top surface of the substrate, the buried insulating pattern contacting the source region and the drain region.

BRIEF DESCRIPTION OF THE DRAWINGS

Exemplary embodiments of the inventive concept will be more clearly understood from the following detailed description taken in conjunction with the accompanying drawings in which.

Figure 1:
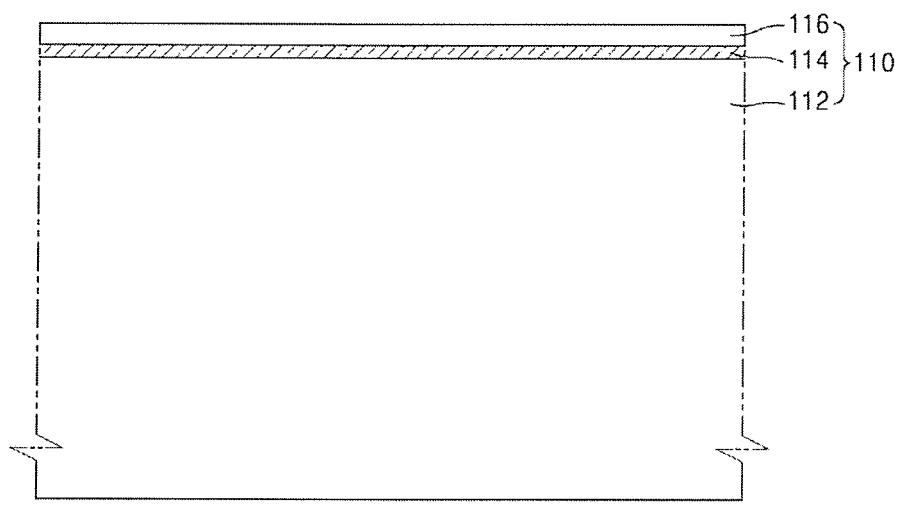
FIGS. 1 through 11 are cross-sectional views illustrating a method of manufacturing a semiconductor device and a main configuration of a semiconductor device according to an exemplary embodiment of the inventive concept.

Since the drawings in FIGS. 1-27 are intended for illustrative purposes, the elements in the drawings are not necessarily drawn to scale. For example, some of the elements may be enlarged or exaggerated for clarity purpose.

DETAILED DESCRIPTION OF THE EMBODIMENTS

Hereinafter, exemplary embodiments of the inventive concept will be described more fully with reference to the accompanying drawings.

FIGS. 1 through 11 are cross-sectional views illustrating a method of manufacturing a semiconductor device and a main configuration of a semiconductor device according to an exemplary embodiment of the inventive concept.

Referring to FIG. 1, a substrate 110 is prepared. The substrate 110 may include a substrate base layer 112, a buried insulating layer 114 that covers the substrate base layer 112, and a semiconductor layer 116 that covers the buried insulating layer 114. The substrate 110 may have a semiconductor on insulator (SOI) structure. That is, the substrate 110 may include the buried insulating layer 114 between the substrate base layer 112 and the semiconductor layer 116.

The substrate base layer 112 may include a semiconductor material. The substrate base layer 112 may include at least one of a III-V group material and a IV group material. The substrate base layer 112 may include, for example, silicon (Si). Alternatively, in an exemplary embodiment of the inventive concept, the substrate base layer 112 may include a semiconductor element, such as germanium (Ge), or a compound semiconductor material, such as, for example, silicon germanium (SiGe), silicon carbide (SiC), gallium arsenide (GaAs), indium arsenide (InAs), gallium antimonide (GaSb), indium antimonide (InSb), gallium phosphide (GaP), or indium phosphide (InP).

The buried insulating layer 114 may include an insulation material. The buried insulating layer 114 may include, for example, silicon oxide. In an exemplary embodiment of the inventive concept, the buried insulating layer 114 may have a thickness of several nm to several tens of nm.

The semiconductor layer 116 may include a semiconductor material. The semiconductor layer 116 may include a semiconductor material that is single crystal. The semiconductor layer 116 may include a material the same as that of the substrate base layer 112. The semiconductor layer 116 may have first conductivity. Alternatively, in an exemplary embodiment of the inventive concept, the semiconductor layer 116 may include a material having a higher electron mobility than that of the substrate base layer 112. The thickness of the semiconductor layer 116 may be greater than the thickness of the buried insulating layer 114. In an exemplary embodiment of the inventive concept, the semiconductor layer 116 may have a thickness of several nm to several tens of nm.

The semiconductor layer 116 may include at least one of a III-V group material and a IV group material. The semiconductor layer 116 may include, for example, Si. Alternatively, the semiconductor layer 116 may include a semiconductor element, such as Ge, or a compound semiconductor material, such as, for example, SiGe, SiC, GaAs, GaSb, InSb, InAs, GaP, or InP. The III-V group material may be a binary, ternary, or quaternary compound including at least one III group element and at least one V group element. The III-V group material may be a compound including at least one of In, Ga, and Al that are III group elements, and at least one of arsenic (As), phosphorus (P), and antimony (Sb) that are V group elements. For example, the III-V group material may be selected from InP, $In_zGa_{1-z}As$ ($0 \le z \le 1$), and $Al_zGa_{1-z}As$ ($0 \le z \le 1$). The binary compound may be, for example, one from among GaP, InP, GaAs, InAs, InSb, and GaSb. The ternary compound may be one from among InGaP, InGaAs, AlInAs, InGaSb, GaAsSb, AlGaAs, AlInSb, AlGaP, InAsSb, and GaAsP. The IV group material may be Si or Ge. However, the III-V group material and the IV group material that may be used in the semiconductor layer 116 in the current embodiment are not limited to the examples.

The substrate 110 may be a prepared SOI wafer. Alternatively, the substrate 110 may be formed by sequentially stacking an insulating layer and a semiconductor layer on a prepared semiconductor wafer.

In an exemplary embodiment of the inventive concept, the buried insulating layer 114 and the semiconductor layer 116 may not be formed on a part of the substrate 110, but only the substrate base layer 112 may be present on the substrate 110. Alternatively, in an exemplary embodiment of the inventive concept, the buried insulating layer 114 is not formed on the part of the substrate 110, and only the substrate base layer 112 and the semiconductor layer 116 may be present on the part of the substrate 110.

Figure 2:
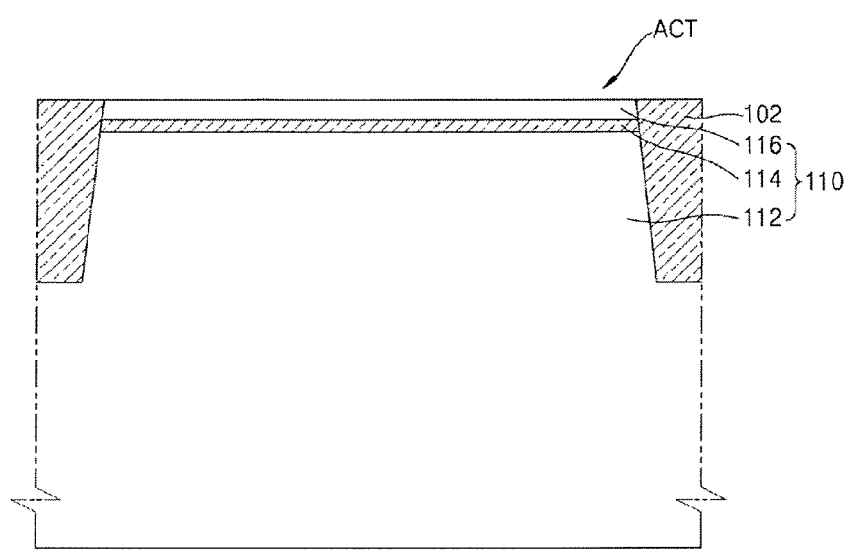

Referring to FIG. 2, an isolation layer 102 may be formed on the substrate 110. An active region ACT is defined by the isolation layer 102 in the substrate 110. The isolation layer 102 may include an insulation material including, for example, at least one of a silicon oxide layer, a silicon nitride layer, a silicon oxynitride layer, and a silicon carbonitride layer. The isolation layer 102 may include a single layer including one type of insulating layer, a double layer or a triple layer including two types of insulating layers, or a multiple layer including a combination of at least three types of insulating layers. For example, the isolation layer 102 may include two types of different insulating layers. For example, the isolation layer 102 may include a silicon oxide layer and a silicon nitride layer. For example, the isolation layer 102 may include a triple layer including a silicon oxide layer, a silicon nitride layer, and a silicon oxide layer.

The isolation layer 102 may be formed to have a bottom surface relatively lower than that of the buried insulating layer 114. For example, the isolation layer 102 may be formed to have a thickness of several hundreds of nm or more.

The isolation layer 102 may be formed by removing a part of the substrate 110 to form trenches and filling the trenches with an insulation material. The isolation layer 102 may be formed using, for example, a plasma enhanced chemical vapor deposition (PECVD) process, a high density plasma CVD (HDP CVD) process, an inductively coupled plasma CVD (ICP CVD) process, a capacitor coupled plasma CVD (CCP CVD) process, a flowable CVD (FCVD) process, and/or a spin coating process. However, a method of forming the isolation layer 102 is not limited to the above-described methods.

Figure 3:
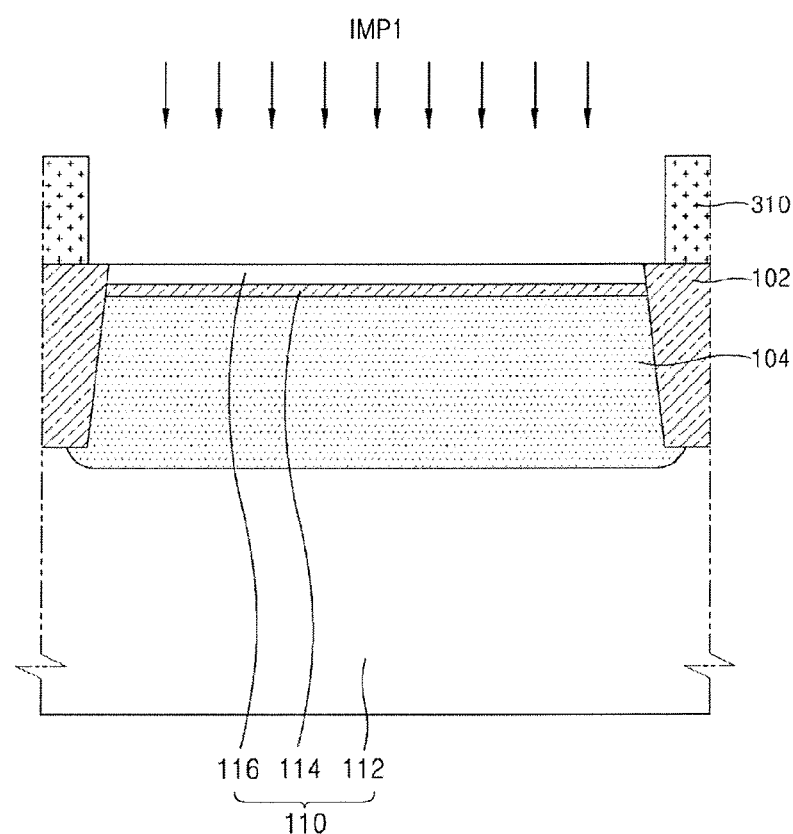

Referring to FIG. 3, after a first mask layer 310 is formed on the substrate 110, a first ion implantation process IMP1 is performed using the first mask layer 310 as an ion implantation mask, so that a base well region 104 may be formed in the substrate 110. The first mask layer 310 may include, for example, a photoresist layer. The photoresist layer may be formed by a lithographic process. The first ion implantation process IMP1 may be performed by implanting ions having first conductivity. In an exemplary embodiment of the inventive concept, in the first ion implantation process IMP1, boron (B) ions are implanted as impurities to form a P-well when an N-channel metal oxide semiconductor (NMOS) transistor is formed, and P or As ions may be implanted as impurities to form an N-well when a P-channel metal oxide semiconductor (PMOS) transistor is formed.

The first ion implantation process IMP1 may be performed, so that a part of the substrate base layer 112 that is lower than the buried insulating layer 114 may be used as a projected range Rp. Rp is the average depth of the implanted ions, and may have the implanted ion concentration at this depth close to and around the depth of the peak concentration. Thus, ions implanted into the substrate 110 through the first ion implantation process IMP1 may be present mainly in a part of the substrate base layer 112, i.e., in the base well region 104. In detail, the greater part of the ions to be implanted into the substrate 110 through the first ion implantation process IMP1 may be implanted into the substrate base layer 112 that corresponds to the projected range Rp, which is around the depth of the peak concentration, and a relatively small quantity of the ions to be implanted into the substrate 110 through the first ion implantation process IMP1 may be implanted into the semiconductor layer 116. Subsequently, when the implanted ions diffuse by thermal treatment so that the base well region 104 is formed, the implanted ions may not diffuse into the semiconductor layer 116 due to the buried insulating layer 114. Thus, a doping concentration of the semiconductor layer 116 may be lower than that of the base well region 104.

In an exemplary embodiment of the inventive concept, a level of a bottom surface of the base well region 104 may be lower than a level of a bottom surface of the isolation layer 102 with respect to a main surface of the substrate 110.

After the first ion implantation process IMP1 is performed, or after the base well region 104 is formed, the first mask layer 310 may be removed. The mask layer may be removed by ashing, stripping or both.

In FIGS. 2 and 3, after the isolation layer 102 is first formed, the base well region 104 is formed. However, in an exemplary embodiment of the inventive concept, after the base well region 104 is first formed, the isolation layer 102 may be formed.

When the buried insulating layer 114 and the semiconductor layer 116 are formed on the semiconductor wafer using the prepared semiconductor wafer as the substrate base layer 112 so as to prepare the substrate 110, in an exemplary embodiment of the inventive concept, after the base well region 104 is first formed on the semiconductor wafer that is the substrate base layer 112, the buried insulating layer 114 and the semiconductor layer 116 may be formed, and then, the isolation layer 102 may be formed. In this case, the semiconductor layer 116 may be formed to have a doping concentration lower than that of the base well region 104.

Figure 4:
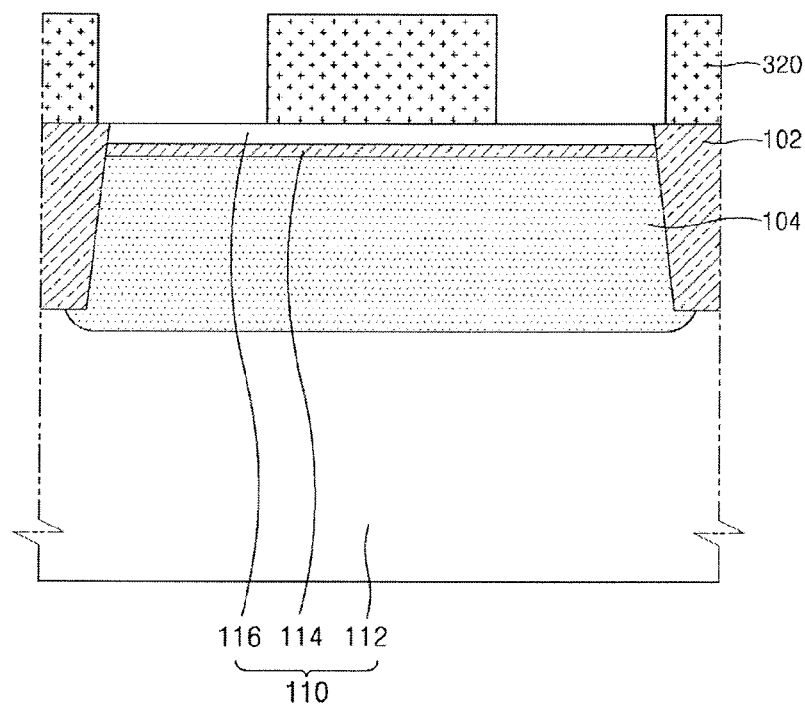

Referring to FIG. 4, a second mask layer 320 is formed on the substrate 110 on which the base well region 104 is formed. The second mask layer 320 may cover a part of the semiconductor layer 116 and may expose the other part thereof. The second mask layer 320 may include, for example, a photoresist layer. The photoresist layer may be formed by a lithographic process. Although it will be described later, the second mask layer 320 may be used as an ion implantation mask for forming a first source/drain region (122 of FIG. 7) by performing a second ion implantation process (IMP2 of FIG. 7).

Figure 5:
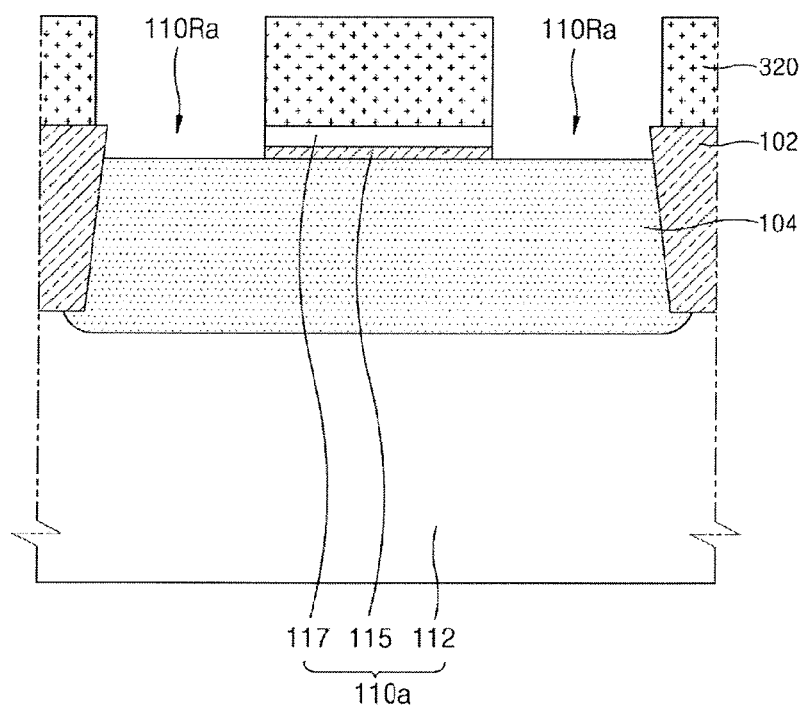

Referring to FIGS. 4 and 5 together, the exposed part of the semiconductor layer 116 and a part of the buried insulating layer 114 that is lower than the semiconductor layer 116 are removed using the second mask layer 320 as an etching mask so that a recess space 110Ra in which a part of the substrate base layer 112 is exposed, may be formed.

The other part of each of the semiconductor layer 116 and the buried insulating layer 114 may remain as semiconductor patterns 117 and buried insulating patterns 115 on the substrate base layer 112. That is, a substrate 110a having the recess space 110Ra includes the substrate base layer 112, the buried insulating patterns 115 that cover a part of the substrate base layer 112, and the semiconductor patterns 117 that cover the buried insulating patterns 115.

When the recess space 110Ra is formed, the part of the substrate base layer 112 may not be removed. That is, the exposed part of the semiconductor layer 116 and the part of the buried insulating layer 114 that is under the exposed part of the semiconductor layer 116 are selectively etched away. However, in an exemplary embodiment of the inventive concept, when a part of each of the semiconductor layer 116 and the buried insulating layer 114 is removed, the part of the substrate base layer 112 exposed when the part of each of the semiconductor layer 116 and the buried insulating layer 114 is removed, may also be removed.

Figure 6:
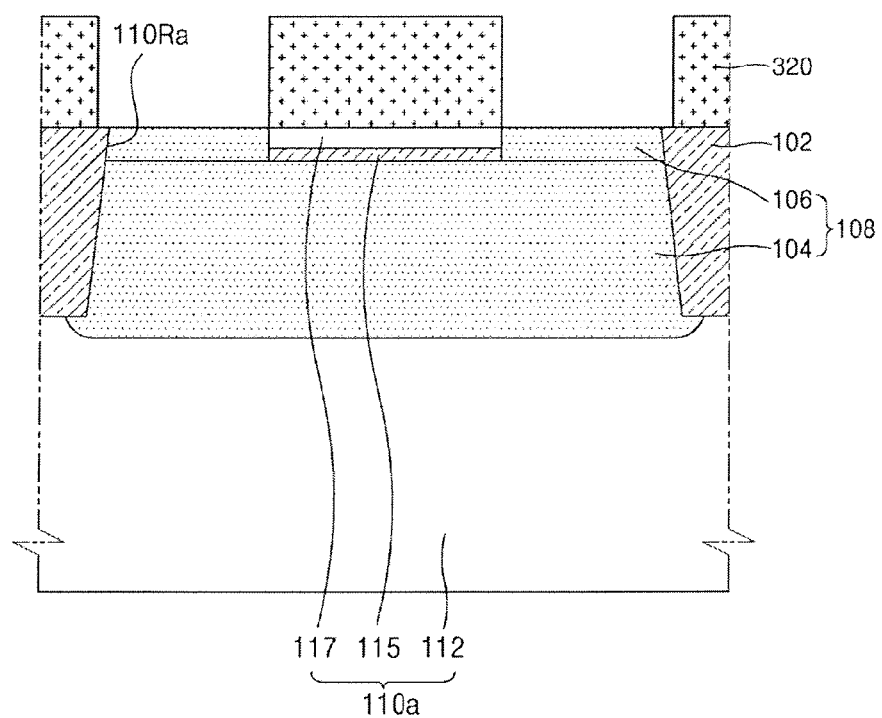

Referring to FIG. 6, a selective epitaxial growth (SEG) process in which the surface of the substrate base layer 112 exposed by the recess space 110Ra is used as a seed, may be performed so that an epitaxial semiconductor layer 106 for filling the recess space 110Ra may be formed. The epitaxial semiconductor layer 106 may be formed of a material the same as that for forming the base well region 104. In an exemplary embodiment of the inventive concept, the epitaxial semiconductor layer 106 may be formed to have a doping concentration the same as or similar to that of the base well region 104. However, exemplary embodiments of the inventive concept are not limited thereto.

The base well region 104 and the epitaxial semiconductor layer 106 may constitute a well region 108.

Figure 7:
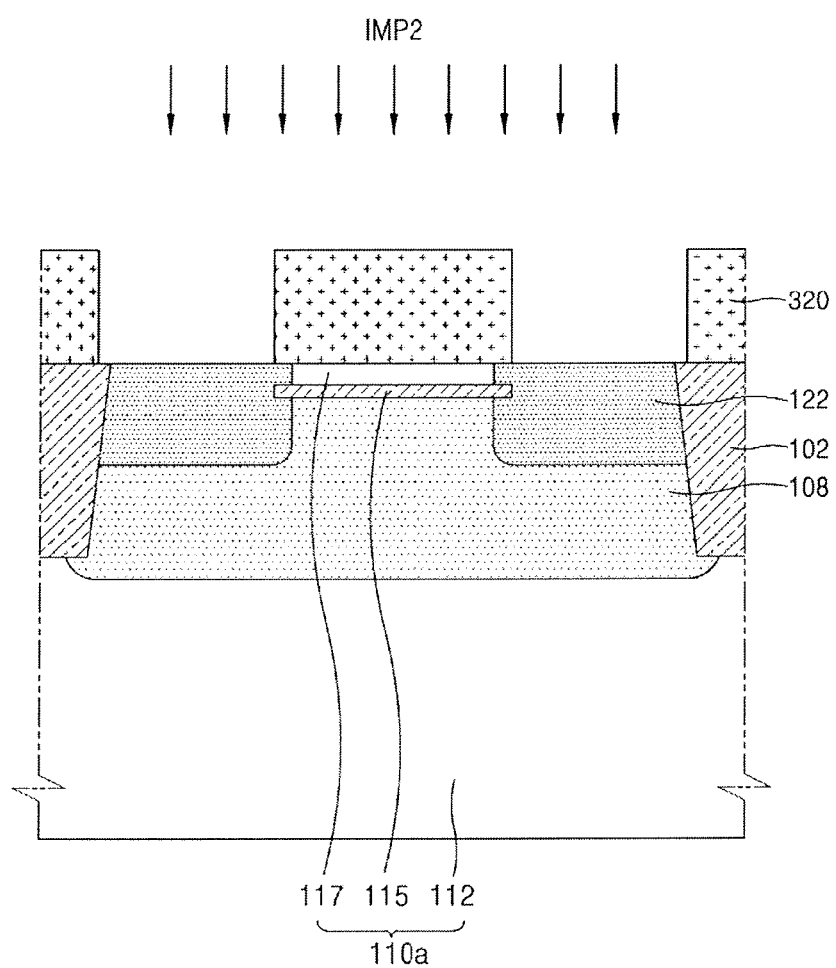

Referring to FIG. 7, a second ion implantation process IMP2 is performed in a state in which a second mask layer 320 is formed on the substrate 110a as an ion implantation mask, so that a first source/drain region 122 may be formed in a part of the well region 108 in the substrate 110a. The second ion implantation process IMP2 may be performed by implanting ions having second conductivity. That is, the first source/drain region 122 may have conductivity that is different from that of the well region 108.

The first source/drain region 122 may extend from a level higher than that of each of the buried insulating patterns 115 to a level lower than that of each of the buried insulating patterns 115, so that a level of a bottom surface of the first source/drain region 122 may be lower than a level of each of the buried insulating patterns 115 with respect to a main surface of the substrate 110a. The first source/drain region 122 may have a bottom surface having a level which is higher than a level of a bottom surface of the well region 108 and a level of a bottom surface of the isolation layer 102 with respect to the main surface of the substrate 110a.

A part of the ions having the second conductivity implanted by the second ion implantation process IMP2 diffuse into a lower side of the second mask pattern 320, so that a part of both ends of each of the buried insulating patterns 115 (both ends in a horizontal direction of FIG. 7) may be in contact with the first source/drain region 122.

When each of the semiconductor patterns 117 and the well region 108 have the same conductivity, for example, the first conductivity, and the first source/drain region 122 has the second conductivity that is different from the first conductivity, a part of both ends of each of the buried insulating patterns 115 disposed between each of the semiconductor patterns 117 and the well region 108 is in contact with the first source/drain region 122, so that each of the semiconductor patterns 117 and the well region 108 having the first conductivity may be electrically separated from each other by the buried insulating patterns 115 and the pair of first source/drain regions 122.

After the first source/drain region 122 is formed, the second mask layer 320 may be removed. The mask layer 320 may be removed by ashing, stripping or both.

Figure 8:
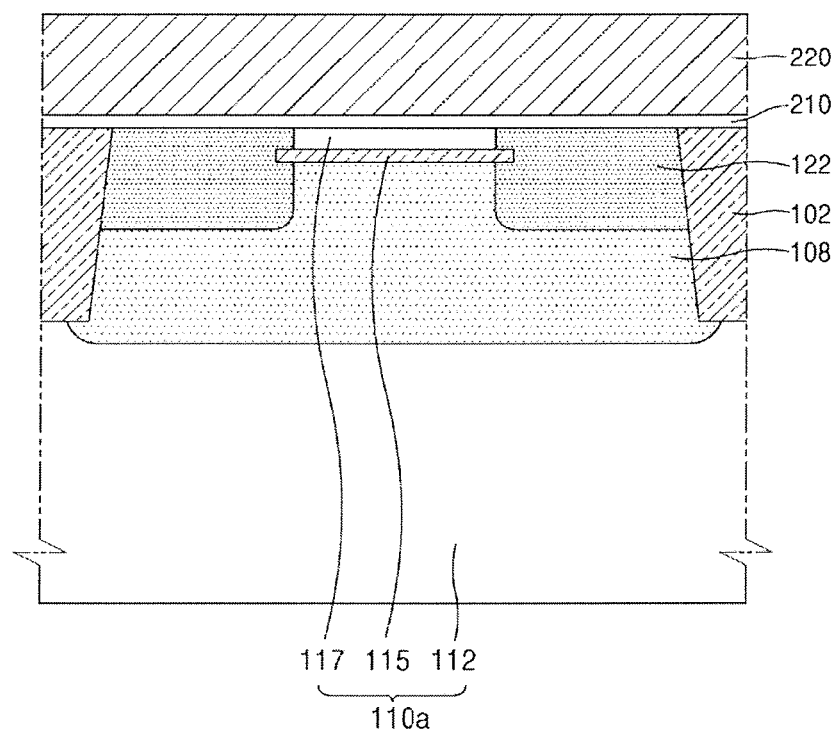

Referring to FIG. 8, a gate insulating material layer 210 and a gate electrode material layer 220 are sequentially formed to cover a top surface of the substrate 110a.

The gate insulating material layer 210 may include, for example, a silicon oxide, a silicon nitride, a silicon oxynitride, a germanium oxide, a dielectric material having a high dielectric constant, or a combination thereof. The dielectric material having the high dielectric constant may have a relative dielectric constant of approximately 10 to 25, which is greater than a relative dielectric constant of a silicon oxide and a silicon nitride. The dielectric material having the high dielectric constant may include, for example, a hafnium oxide, a hafnium oxynitride, a hafnium silicon oxide, a lanthanum oxide, a lanthanum aluminum oxide, a zirconium oxide, a zirconium silicon oxide, a tantalum oxide, a titanium oxide, a barium strontium titanium oxide, a barium titanium oxide, a strontium titanium oxide, an yttrium oxide, an erbium oxide, a dysprosium oxide, a gadolinium oxide, an aluminum oxide, a lead scandium tantalum oxide, and a lead zinc niobate, or a combination thereof. However, the material for forming the dielectric material having the high dielectric constant is not limited thereto. The gate insulating material layer 210 may be formed through a process, such as, for example, thermal oxidation, atomic layer deposition (ALD), chemical vapor deposition (CVD), or physical vapor deposition (PVD). The gate insulating material layer 210 may have a thickness of, for example, several tens of Å to several hundreds of Å. However, the thickness of the gate insulating material layer 210 is not limited thereto. In an exemplary embodiment of the inventive concept, when the gate insulating material layer 210 is formed through a thermal oxidation process, the gate insulating material layer 210 may not be formed on the isolation layer 102.

The gate electrode material layer 220 may include, for example, polysilicon, at least one metal of titanium (Ti), tantalum (Ta), aluminum (Al), tungsten (W), ruthenium (Ru), niobium (Nb), molybdenum (Mo), hafnium (Hf), nickel (Ni), cobalt (Co), platinum (Pt), ytterbium (Yb), terbium (Tb), dysprosium (Dy), erbium (Er), and palladium (Pd), a metal nitride including at least one metal, a metal doped with carbon, or a metal compound such as a metal nitride doped with carbon. The gate electrode material layer 220 may include a single layer or a multiple layer including a plurality of layers.

The gate electrode material layer 220 may be formed through a process, such as, for example, ALD, CVD, PVD, metal organic ALD (MOALD), or metal organic CVD (MOCVD).

Figure 9:
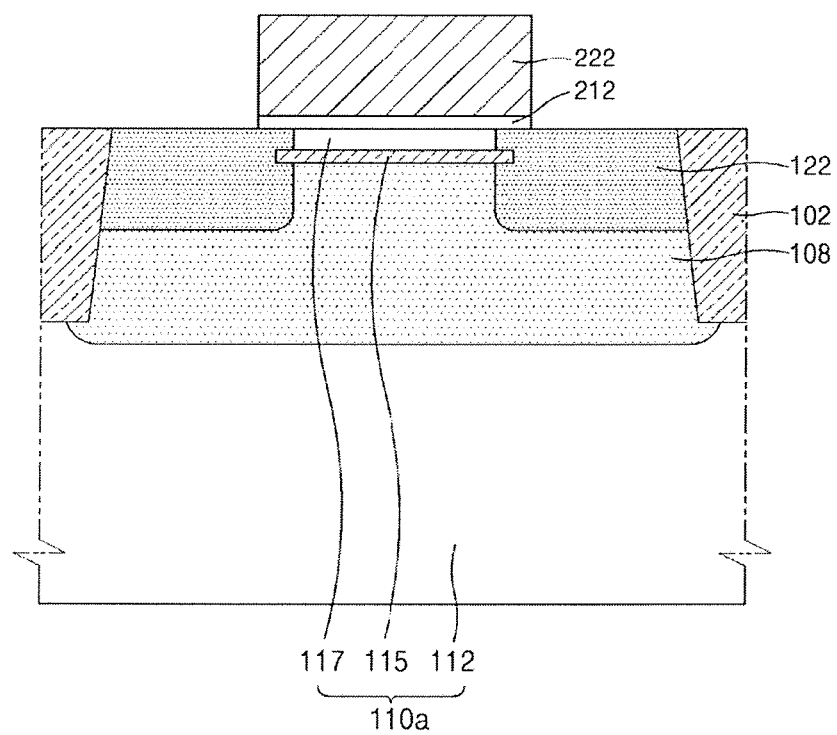

Referring to FIGS. 8 and 9, the gate insulating material layer 210 and the gate electrode material layer 220 are patterned, so that a gate insulating layer 212 and a gate electrode 222 may be respectively formed. The gate insulating layer 212 and the gate electrode 222 may be formed by a patterning process including lithographic and etching procedures.

The gate electrode 222 may have a shape of an extending line in a direction perpendicular to a direction in a space between a pair of first source/drain regions 122 (in a horizontal direction of FIG. 9). The extending direction may be parallel to a top surface of the substrate. The direction in the space between the pair of first source/drain regions 122 is the direction from one of the pair of first source/drain regions 122 directly crossing the space to the other one of the pair of first source/drain regions 122.

The gate electrode 222 may be formed so that all buried insulating patterns 115 may overlap with gate electrode 222. In an exemplary embodiment of the inventive concept, a width of each of the buried insulating patterns 115 may be smaller than a width of the gate electrode 222 between the pair of first source/drain regions 122.

A width of a gate electrode, when the gate electrode has a shape of an extending line, in the present specification means a physical width of the gate electrode in a direction perpendicular to a direction in which the gate electrode extends. Thus, the width of the gate electrode means the physical width of the gate electrode in a direction in a space between a pair of first source/drain regions 122. That is, the width of the gate electrode in the present specification means a physical width of the gate electrode in a direction of a gate length Lg that corresponds to a movement distance of electrons in a flow direction of a current in a channel of a transistor having the gate electrode, and does not mean a gate width or channel width in a direction perpendicular to the flow direction of the current in the channel.

A part of each of the pair of first source/drain regions 122 may overlap a part of the gate electrode 222 in a direction perpendicular to the main surface of the substrate 110a. That is, a part of opposite ends of each of the pair of first source/drain regions 122 may extend to a lower side of the gate electrode 222.

Figure 10:
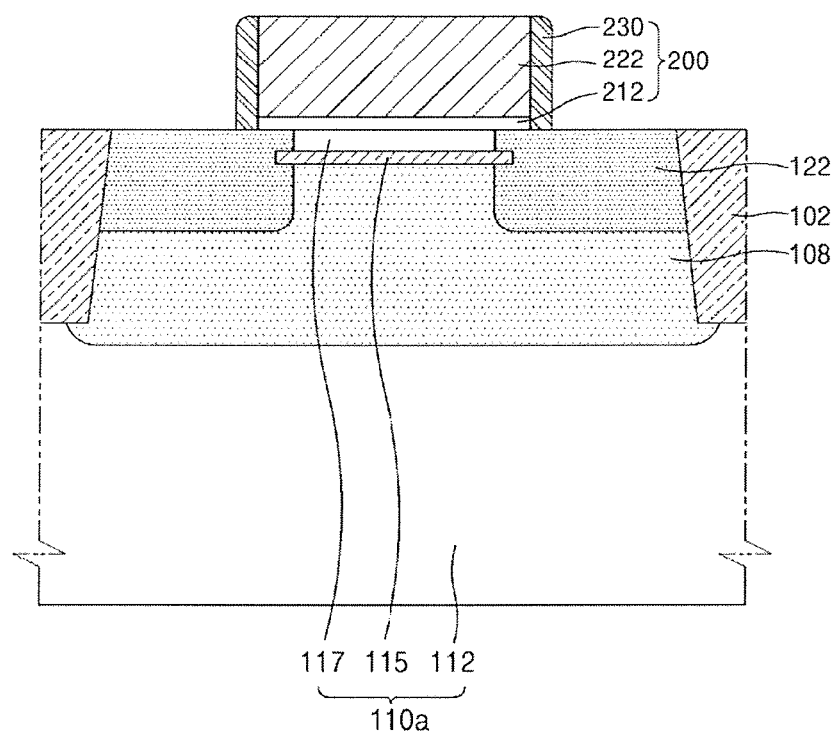

Referring to FIG. 10, a pair of insulation spacers 230 are formed on both sidewalls of the gate insulating layer 212 and the gate electrode 222, so that a gate structure 200 including the gate insulating layer 212, the gate electrode 222, and the pair of insulation spacers 230 may be formed. The pair of insulation spacers 230 may be formed by depositing a spacer layer over the above described substrate having the gate insulating layer 212 and the gate electrode 222 followed by selectively etching the spacer layer. Spacer layer may be formed using any suitable layer formation techniques available in semiconductor processing, for example, CVD, ALD, PVD, and the like. The spacer layer may then be selectively removed by, for example, an anisotropic dry etch to expose a top portion of gate electrode 222 and top portions of the pair of first source/drain regions 122. Thus, the pair of insulation spacers 230 are remained on both sidewalls of the gate insulating layer 212 and the gate electrode 222.

Each of the insulation spacers 230 may include, for example, a silicon nitride, a silicon oxynitride, a silicon oxynitride including carbon, or a composite layer thereof, or may have an air gap or a low dielectric layer formed therein. In an exemplary embodiment of the inventive concept, each of the insulation spacers 230 may be a composite layer including an L-shaped first insulation spacer and a second insulation spacer formed on the first insulation spacer. In an exemplary embodiment of the inventive concept, the second insulation spacer may be omitted. In this case, each of the insulation spacers 230 may have only the L-shaped first insulation spacer. In an exemplary embodiment of the inventive concept, each of the insulation spacers 230 may further include an air gap formed in a space between the first insulation spacer and the second insulation spacer. In an exemplary embodiment of the inventive concept, the insulation spacers 230 may be formed, so that the low dielectric layer having a dielectric constant relatively lower than dielectric constants of the first and second insulation spacers may be filled in the air gap space.

Figure 11:
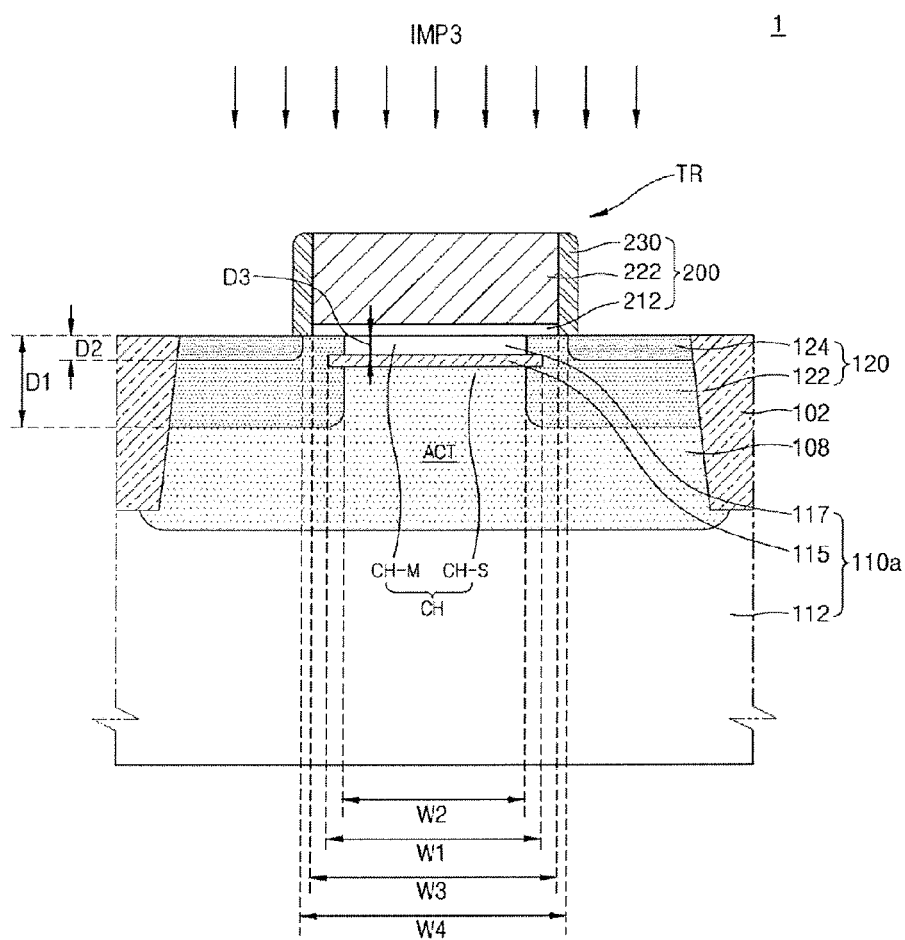

Referring to FIG. 11, a third ion implantation process IMP3 is performed so that a second source/drain region 124 may be formed in a part of the first source/drain region 122 in the substrate 110a, and a semiconductor device 1 having a source/drain region 120 including the first source/drain region 122 and the second source/drain region 124 may be formed. In the third implantation process, the second source/drain region 124 may be formed using gate structure 200 as an ion implantation mask.

The third ion implantation process IMP3 may be performed by implanting ions having second conductivity. That is, the second source/drain region 124 may have the same conductivity as that of the first source/drain region 122. A level of a bottom surface of the second source/drain region 124 may be higher than a level of a bottom surface of the first source/drain region 122 with respect to the main surface of the substrate 110a. A doping concentration of the second source/drain region 124 may be greater than a doping concentration of the first source/drain region 122.

The semiconductor device 1 includes the substrate 110a having the active region ACT including a channel region CH, the gate structure 200 formed in the active region ACT in which the channel region CH is formed, and the pair of source/drain regions 120 formed in the substrate 110a at both sides of the gate structure 200.

The substrate 110a includes the substrate base layer 112, the buried insulating patterns 115 disposed on the substrate base layer 112, and the semiconductor patterns 117 disposed on the buried insulating patterns 115. The buried insulating patterns 115 may be formed in the substrate 110a and disposed in the channel region CH at a lower side of the gate structure 200, so as to be spaced a predetermined distance from a top surface of the substrate 110a.

A part of the substrate base layer 112 and each of the semiconductor patterns 117 may constitute the channel region CH. The channel region CH may have first conductivity. The channel region CH may include an upper channel region CH-M disposed on an upper side of each of the buried insulating patterns 115 and a lower channel region CH-S disposed on a lower side of each of the buried insulating patterns 115, which are separated from each other by each of the buried insulating patterns 115 and the pair of source/drain regions 120. The upper channel region CH-M may correspond to the semiconductor patterns 117, and the lower channel region CH-S may be a part of the substrate base layer 112 at the lower side of each of the buried insulating patterns 115. As described previously with reference to FIG. 3, ions implanted into the substrate 110 through the first ion implantation process IMP1 may be present mainly in a part of the substrate base layer 112, and a relatively small quantity of the ions may be implanted into the semiconductor layer 116 which is subsequently patterned to form the semiconductor patterns 117. In addition, the buried insulating layer 114, which is subsequently patterned to form the buried insulating patterns 115, may prevent the implanted ions from diffusing into the semiconductor layer 116 during thermal treatment. Thus, a doping concentration of the upper channel region CH-M may be lower than that of the lower channel region CH-S.

The gate structure 200 may include a gate insulating layer 212 that covers a top surface of the active region ACT in which the channel region CH is formed, a gate electrode 222 that covers the gate insulating layer 212 on the top surface of the active region ACT in which the channel region CH is formed, and a pair of insulation spacers 230 formed on both sidewalls of the gate insulating layer 212 and the gate electrode 222. All of the buried insulating patterns 115 may overlap the gate electrode 222 in a direction perpendicular to the main surface of the substrate 110a.

The pair of source/drain regions 120 may be formed in the substrate 110a at both sides (ends) of each of the buried insulating patterns 115, so as to extend from the top surface of the substrate 110a to a level lower than that of the buried insulating patterns 115. The pair of source/drain regions 120 may have second conductivity that is different from the first conductivity. A part of each of the pair of source/drain regions 120 may overlap a part of the gate electrode 222 in a direction perpendicular to the main surface of the substrate 110a. A part of both ends of each of the buried insulating patterns 115 may be in contact with each of the pair of source/drain regions 120. Thus, the upper channel region CH-M having the first conductivity may be surrounded by the buried insulating patterns 115 and the pair of source/drain regions 120 having the second conductivity and separated from the lower channel region CH-S having the first conductivity. Thus, the upper channel region CH-M and the lower channel region CH-S may be electrically separated from each other.

Each of the source/drain regions 120 may include a first source/drain region 122 and a second source/drain region 124. The second source/drain region 124 may have a doping concentration higher than that of the first source/drain region 122. The first source/drain region 122 may extend more to the lower side of the gate electrode 122 than the second source/drain region 124 may extend. Also, a level of a bottom surface of the first source/drain region 122 may be lower than a level of a bottom surface of the second source/drain region 124 with respect to the main surface of the substrate 110a. Each of the opposite ends of the pair of second source/drain regions 124 of the pair of source/drain regions 120 may be located at a lower side of each of the insulation spacers 230. That is, a part of one end of the second source/drain region 124 may extend to the lower side of the gate structure 200.

A part of both ends of each of the buried insulating patterns 115 may be in contact with the first source/drain region 122 of each of the pair of source/drain regions 120. In an exemplary embodiment of the inventive concept, a part of both ends of each of the buried insulating patterns 115 may be in contact with an upper portion of the first source/drain region 122. That is, a part of both ends of each of the buried insulating patterns 115 may extend into the first source/drain region 122. The buried insulating patterns 115 may be in contact with the first source/drain region 122 but may be spaced apart from the second source/drain region 124.

Each of the buried insulating patterns 115 may have a first width W1 in a direction of a space between the pair of source/drain regions 120. The direction of the space between the pair of source/drain regions 120 is the direction from one of the pair of source/drain regions 120 directly crossing the space to the other one of the pair of source/drain regions 120. A distance between the pair of first source/drain regions 122 of the pair of source/drain regions 120 may have a second width W2. The gate electrode 222 may have a third width W3 in the direction of the space between the pair of source/drain regions 120. A distance between the pair of second source/drain regions 124 of the pair of source/drain regions 120 may have a fourth width W4.

The first width W1 may be greater than the second width W2. Thus, a part of both ends of each of the buried insulating patterns 115 may be in contact with the first source/drain region 122 and may extend into the first source/drain region 122. The first width W1 may be smaller than the third width W3. Thus, all of the buried insulating patterns 115 may overlap the gate electrode 222 in a direction perpendicular to the main surface of the substrate 110a. The first width W1 may be smaller than a fourth width W4. Thus, each of the buried insulating patterns 115 may be spaced apart from the second source/drain region 124.

The second width W2 may be smaller than the third width W3. Thus, a part of the first source/drain region 122 may overlap a part of the gate electrode 222 in a direction perpendicular to the main surface of the substrate 110a. The second width W2 may be smaller than the fourth width W4. Thus, the first source/drain region 122 may extend further to the lower side of the gate electrode 222 than the second source/drain region 124 may extend.

The third width W3 may be smaller than the fourth width W4. Thus, a part of opposite ends of the pair of second source/drain regions 124 of the pair of source/drain regions 120 may extend to the lower side of the gate structure 200, and one end of the second source/drain region 124 may be located at a lower side of one of the pair of insulation spacers 230.

The first source/drain region 122 may have a first depth D1 from a top surface of the substrate 110a, and the second source/drain region 124 may have a second depth D2 that is smaller than the first depth D1 from the top surface of the substrate 110a. Thus, a level of a bottom surface of the first source/drain region 122 may be lower than a level of the bottom surface of the second source/drain region 124 with respect to the main surface of the substrate 110a.

Each of the buried insulating patterns 115 may have the third depth D3 from the top surface of the substrate 110a and may be disposed in the channel region CH of the lower side of the gate electrode 222. Thus, the buried insulating patterns 115 may be spaced apart from the top surface of the substrate 110a.

The third depth D3 may be smaller than the first depth D1. Thus, the source/drain region 120, in particular, a bottom surface of the first source/drain region 122 may extend to a level lower than that of each of the buried insulating patterns 115 from the top surface of the substrate 110a.

The semiconductor device 1 may include a transistor TR including the active region ACT in which the channel region CH is formed, the gate insulating layer 212, the gate electrode 222, and the pair of source/drain regions 120.

The channel region CH of the transistor TR may include an upper channel region CH-M disposed at an upper side of the buried insulating patterns 115 and a lower channel region CH-S disposed at a lower side of the buried insulating patterns 115, which are separated from each other by the buried insulating patterns 115. A part of both ends of each of the buried insulating patterns 115 may be in contact with each of the pair of source/drain regions 120.

When the transistor TR is turned on, portions of current that flow through the channel region CH may flow together into the upper channel region CH-M and the lower channel region CH-S. Because a doping concentration of the upper channel region CH-M may be less than the doping concentration of the lower channel region CH-S, there may be relatively more portions of current that flow through the upper channel region CH-M having relatively higher mobility among the portions of current that flow through the channel region CH. Thus, when the semiconductor device 1 has a plurality of transistors TR, a difference in threshold voltages between transistors TR may be reduced so that mismatch of threshold voltages of the plurality of transistors TR may be reduced.

Because the transistor TR has both a current path of the channel region CH-M at the upper side of each of the buried insulating patterns 115 and a current path of the channel region CH-S at the lower side of each of the buried insulating patterns 115, the entire current characteristics of the transistor TR may be enhanced.

Because the first source/drain region 122 having a relatively low doping concentration has a bottom surface having a level which is lower than a level of each of the buried insulating patterns 115 with respect to the main surface of the substrate 110a, on a condition that a drain bias voltage is high, an electric field applied to a drain of the channel region CH may be dispersed into the upper channel region CH-M and the lower channel region CH-S along a depth of the first source/drain region 122. Thus, the transistor TR may have relatively high breakdown voltage characteristics.

In the semiconductor device 1 according to the current embodiment, due to the buried insulating patterns 115 that are locally disposed only at the lower side of the gate electrode 222 of the transistor TR and not disposed at the other part of the source/drain region 120 than the lower side of the gate electrode 222, current characteristics having a high operating voltage of several V to several tens of V may be enhanced, and mismatch of threshold voltages may be reduced, and high breakdown voltage characteristics may be obtained.

Figure 12:
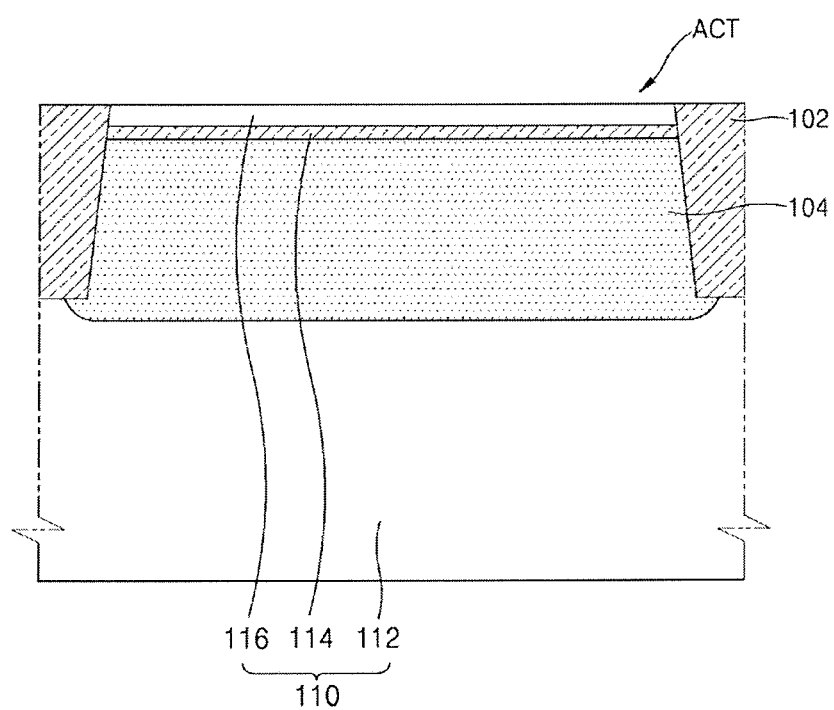
FIGS. 12 through 19 are cross-sectional views illustrating a method of manufacturing a semiconductor device and a main configuration of a semiconductor device according to an exemplary embodiment of the inventive concept.

FIGS. 12 through 19 are cross-sectional views of a method of manufacturing a semiconductor device and a main configuration of a semiconductor device according to an exemplary embodiment of the inventive concept. In FIGS. 12 through 19, same reference numerals as those of FIGS. 1 through 11 represent same elements, and in the description that follows, the redundant descriptions of these elements may be omitted. Specifically, FIG. 12 is a cross-sectional view illustrating a method of manufacturing a semiconductor device after the operation of FIG. 3 is performed.

Referring to FIG. 12, a substrate 110 having a base well region 104 formed therein is prepared.

The substrate 110 includes a substrate base layer 112, a buried insulating layer 114 that covers the substrate base layer 112, and a semiconductor layer 116 that covers the buried insulating layer 114. The substrate 110 may have a semiconductor on insulator (SOI) structure. That is, the substrate 110 may include the buried insulating layer 114 between the substrate base layer 112 and the semiconductor layer 116.

The substrate base layer 112 may include a semiconductor material. The buried insulating layer 114 may include an insulation material. The semiconductor layer 116 may include a semiconductor material. The semiconductor layer 116 may include a semiconductor material that is a single crystal. For example, the semiconductor layer 116 may include a material the same as a material for forming the substrate base layer 112. The semiconductor layer 116 may have first conductivity.

The substrate 110 may be a prepared SOI wafer. Alternatively, an insulating layer and a semiconductor layer may be sequentially stacked on the prepared semiconductor wafer.

In an exemplary embodiment of the inventive concept, the buried insulating layer 114 and the semiconductor layer 116 are not formed on a part of the substrate 110, and only the substrate base layer 112 may be present on the substrate 110. Alternatively, in an exemplary embodiment of the inventive concept, the buried insulating layer 114 may not be formed on the part of the substrate 110, and only the substrate base layer 112 and the semiconductor layer 116 may be present on the substrate 110.

An isolation layer 102 for defining an active region ACT is formed on the substrate 110. The isolation layer 102 may include an insulation material. The isolation layer 102 may be formed to have a bottom surface relatively lower than that of the buried insulating layer 114. The isolation layer 102 may be formed by removing a part of the substrate 110 to form trenches and filling the trenches with the insulation material.

A base well region 104 may be formed by performing a first ion implantation process (IMP1 of FIG. 3) of implanting ions having first conductivity into the substrate 110. The first ion implantation process IMP1 may be performed so that a part of the substrate base layer 112 that is lower than the buried insulating layer 114 may be used as a projected range Rp. Thus, ions implanted into the substrate 110 through the first ion implantation process IMP1 may be present mainly in a part of the substrate base layer 112, i.e., in the base well region 104. In detail, the greater part of the ions to be implanted into the substrate 110 through the first ion implantation process IMP1 may be implanted into the substrate base layer 112 that corresponds to the projected range Rp, which is around the depth of the peak concentration, and a relatively small quantity of the ions to be implanted into the substrate 110 through the first ion implantation process IMP1 may be implanted into the semiconductor layer 116. Subsequently, when the implanted ions diffuse by thermal treatment so that the base well region 104 may be formed, the implanted ions may not diffuse into the semiconductor layer 116 due to the buried insulating layer 114. Thus, a doping concentration of the semiconductor layer 116 may be less than that of the base well region 104.

In an exemplary embodiment of the inventive concept, a level of a bottom surface of the base well region 104 may be lower than a level of a bottom surface of the isolation layer 102 with respect to a main surface of the substrate 110.

Figure 13:
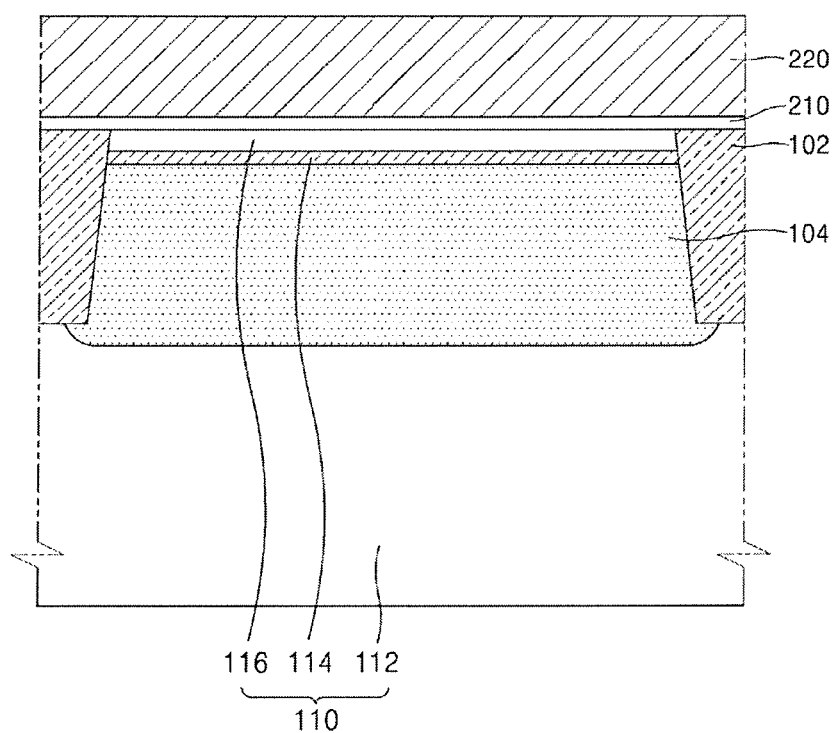

Referring to FIG. 13, a gate insulating material layer 210 and a gate electrode material layer 220 are sequentially formed to cover a top surface of the substrate 110.

The gate insulating material layer 210 may include, for example, a silicon oxide, a silicon nitride, a silicon oxynitride, a germanium oxide, a dielectric material having a high dielectric constant, or a combination thereof.

The gate electrode material layer 220 may include, for example, polysilicon, at least one metal of Ti, Ta, Al, W, Ru, Nb, Mo, Hf, Ni, Co, Pt, Yb, Tb, Dy, Er, and Pd, a metal nitride including at least one metal, a metal doped with carbon, or a metal compound such as a metal nitride doped with carbon.

Figure 14:
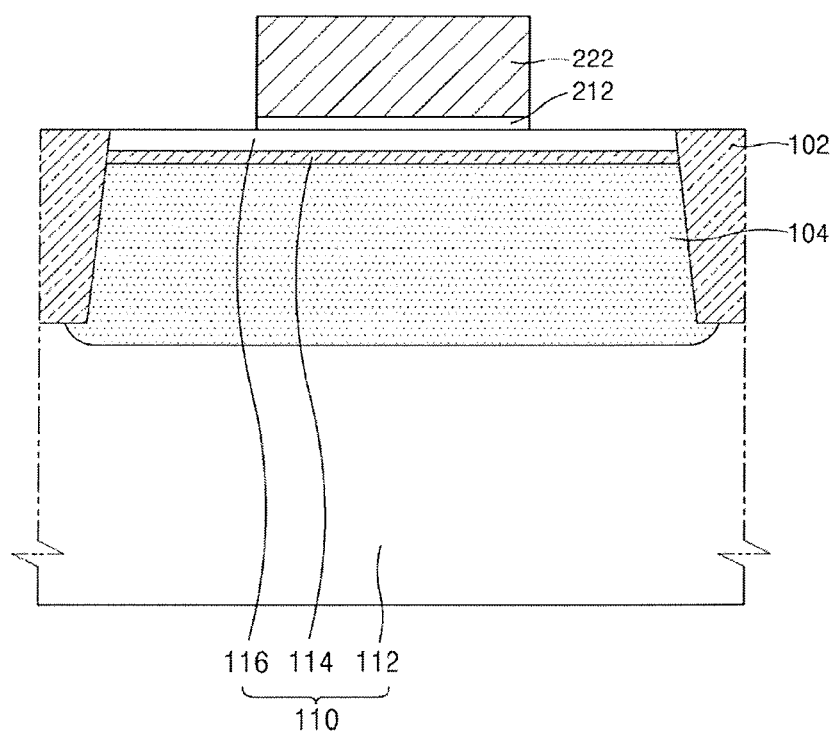

Referring to FIGS. 13 and 14 together, the gate insulating material layer 210 and the gate electrode material layer 220 are patterned so that a gate insulating layer 212 and a gate electrode 222 may be formed. The gate insulating layer 212 and the gate electrode 222 may be formed by a patterning process including lithographic and etching procedures.

Figure 15:
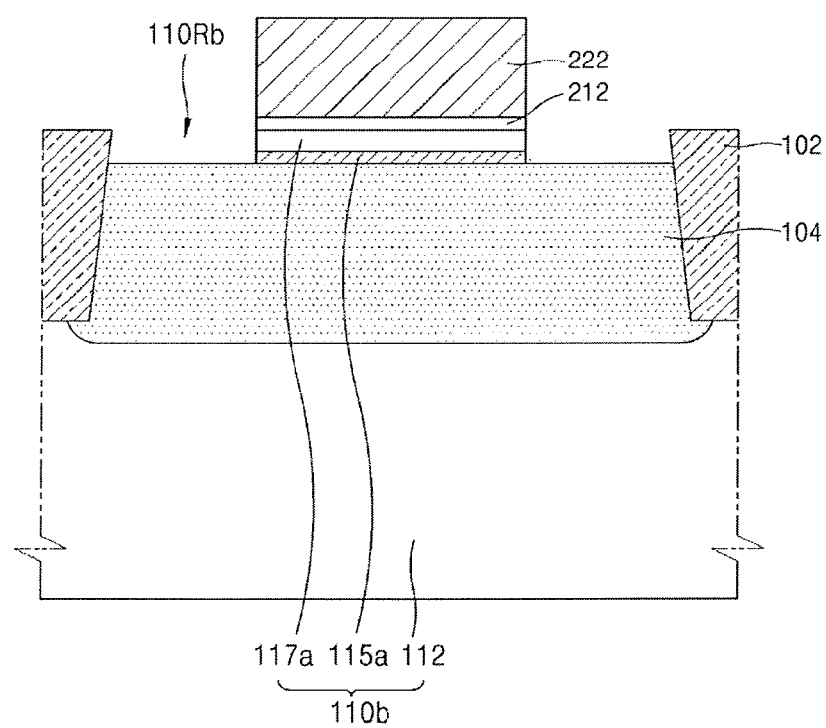

Referring to FIGS. 14 and 15 together, a part of each of the semiconductor layer 116 and the buried insulating layer 114 is removed using the gate electrode 222 as an etching mask, so that a recess space 110Rb in which a part of the substrate base layer 112 is exposed, may be formed. The gate electrode 222 may be a mask layer for removing a part of each of the semiconductor layer 116 and the buried insulating layer 114.

The other part of each of the semiconductor layer 116 and the buried insulating layer 114 may remain as semiconductor patterns 117a or buried insulating patterns 115a on the substrate base layer 112. That is, a substrate 110b having the recess space 110Rb formed therein includes the substrate base layer 112, the buried insulating patterns 115a that covers a part of the substrate base layer 112, and the semiconductor patterns 117a that cover the buried insulating patterns 115a.

Figure 16:
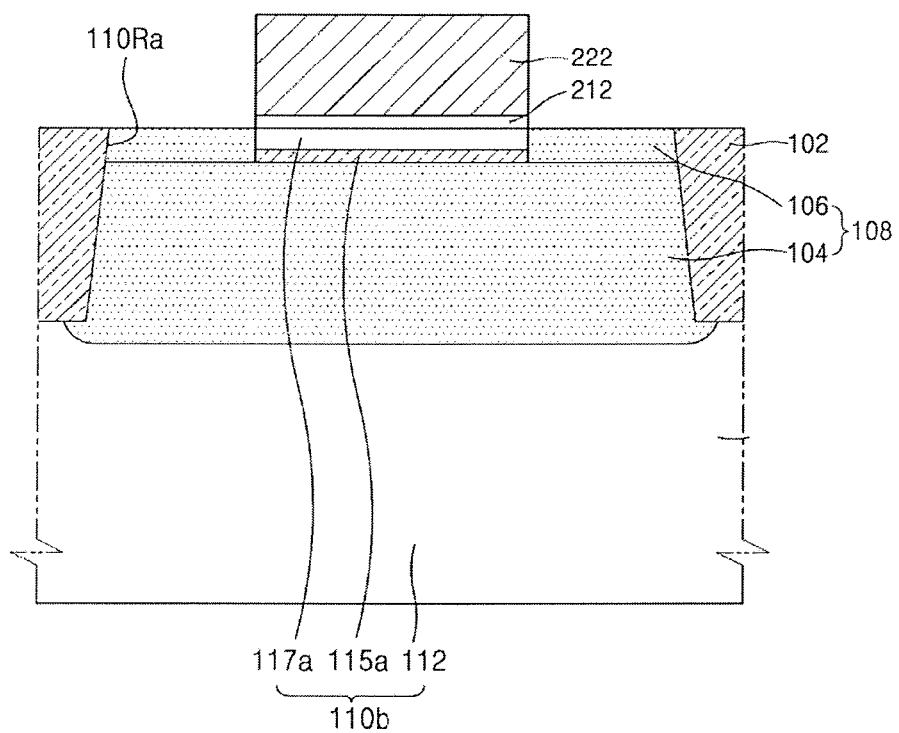

Referring to FIG. 16, an SEG process in which the surface of the substrate base layer 112 exposed by the recess space 110Rb is used as a seed, may be performed so that an epitaxial semiconductor layer 106 for filling the recess space 110Rb may be formed. The epitaxial semiconductor layer 106 may be formed of a material the same as that for forming the base well region 104. In an exemplary embodiment of the inventive concept, the epitaxial semiconductor layer 106 may be formed to have a doping concentration the same as or similar to that of the base well region 104. However, exemplary embodiments of the inventive concept are not limited thereto.

The base well region 104 and the epitaxial semiconductor layer 106 may constitute a well region 108.

Figure 17:
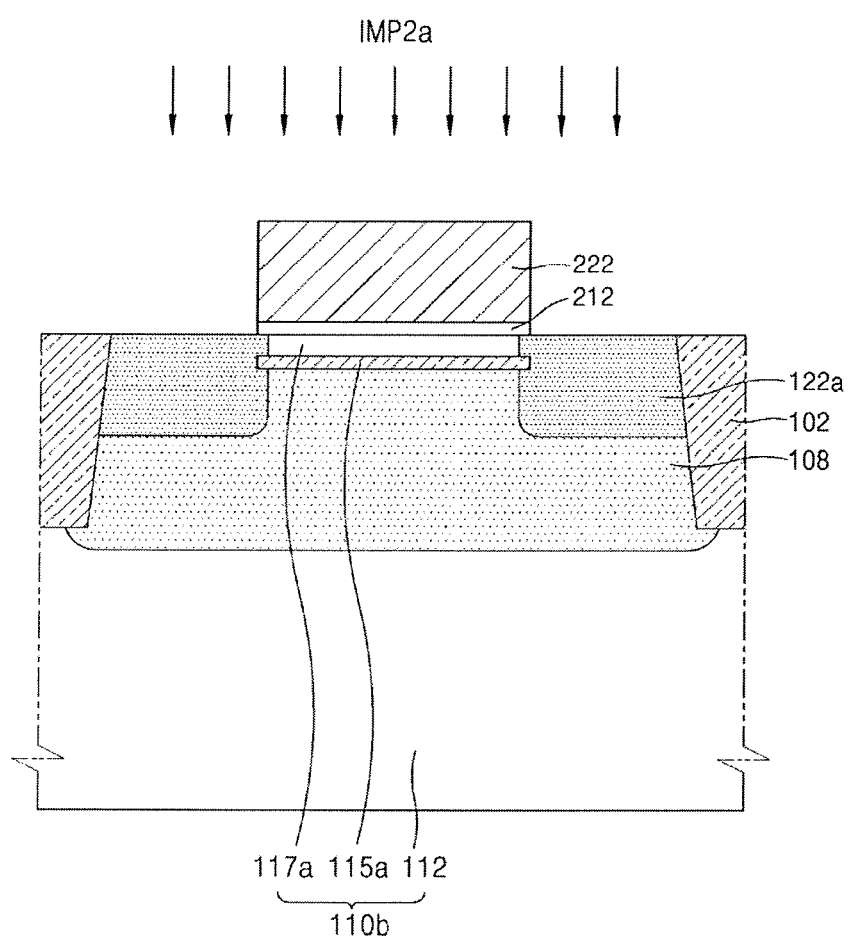

Referring to FIG. 17, a second ion implantation process IMP2a is performed in a state in which the gate electrode 222 is formed on the substrate 110b as an ion implantation mask, so that a first source/drain region 122a may be formed in a part of the well region 108 in the substrate 110b. The second ion implantation process IMP2a may be performed by implanting ions having second conductivity. That is, the first source/drain region 122a may have conductivity that is different from that of the well region 108.

The first source/drain region 122a may extend from a level higher than that of each of the buried insulating patterns 115a to a level lower than that of each of the buried insulating patterns 115a, so that a level of a bottom surface of the first source/drain region 122a may be lower than a level of each of the buried insulating patterns 115a with respect to a main surface of the substrate 110b. The first source/drain region 122a may have a bottom surface having a level which is higher than a level of a bottom surface of the well region 108 and a level of a bottom surface of the isolation layer 102 with respect to the main surface of the substrate 110b.

A part of the ions having the second conductivity implanted by the second ion implantation process IMP2a diffuse into a lower side of the gate electrode 222 so that a part of both ends of each of the buried insulating patterns 115a (both ends in a horizontal direction of FIG. 17) may be in contact with the first source/drain region 122a.

When each of the semiconductor patterns 117a and the well region 108 have the same conductivity, for example, the first conductivity, and the first source/drain region 122a has the second conductivity that is different from the first conductivity, a part of both ends of each of the buried insulating patterns 115a disposed between each of the semiconductor patterns 117a and the well region 108 is in contact with the first source/drain region 122a, so that each of the semiconductor patterns 117a and the well region 108 having the first conductivity may be electrically separated from each other by the buried insulating patterns 115a and the pair of first source/drain regions 122a.

Figure 18:
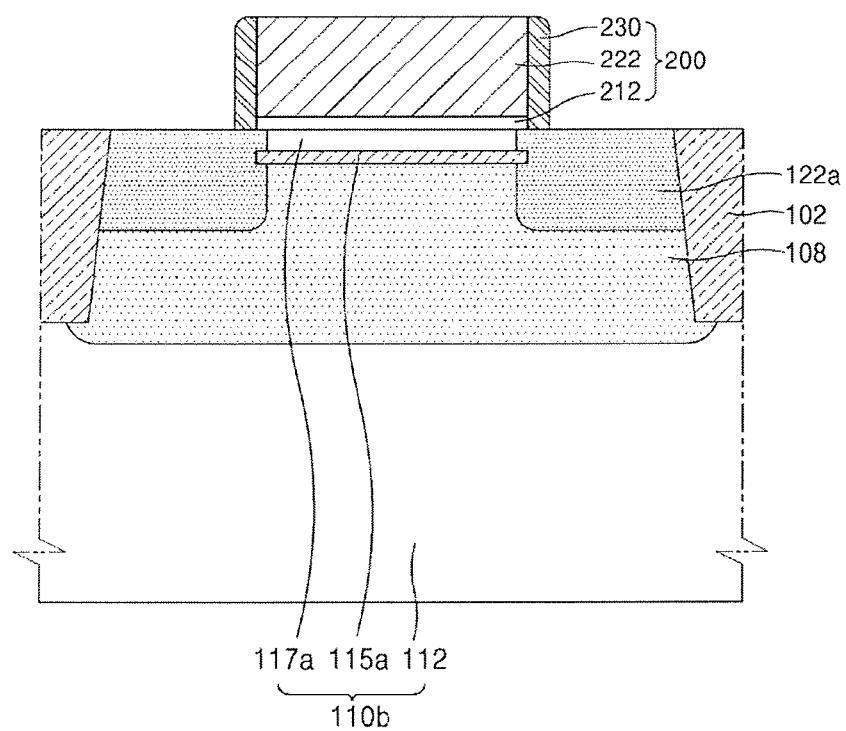

Referring to FIG. 18, a pair of insulation spacers 230 are formed on both sidewalls of the gate insulating layer 212 and the gate electrode 222, so that a gate structure 200 including the gate insulating layer 212, the gate electrode 222, and the pair of insulation spacers 230 may be formed. The pair of insulation spacers 230 may be formed by depositing a spacer layer over the above described substrate having the gate insulating layer 212 and the gate electrode 222 followed by selectively etching the spacer layer. Spacer layer may be formed using any suitable layer formation techniques available in semiconductor processing, for example, CVD, ALD, PVD, and the like. The spacer layer may then be selectively removed by, for example, an anisotropic dry etch to expose a top portion of gate electrode 222 and top portions of the pair of first source/drain regions 122. Thus, the pair of insulation spacers 230 are remained on both sidewalls of the gate insulating layer 212 and the gate electrode 222. Each of the insulation spacers 230 may include, for example, a silicon nitride, a silicon oxynitride, a silicon oxynitride including carbon, or a composite layer thereof, or may have an air gap or a low dielectric layer formed therein.

Figure 19:
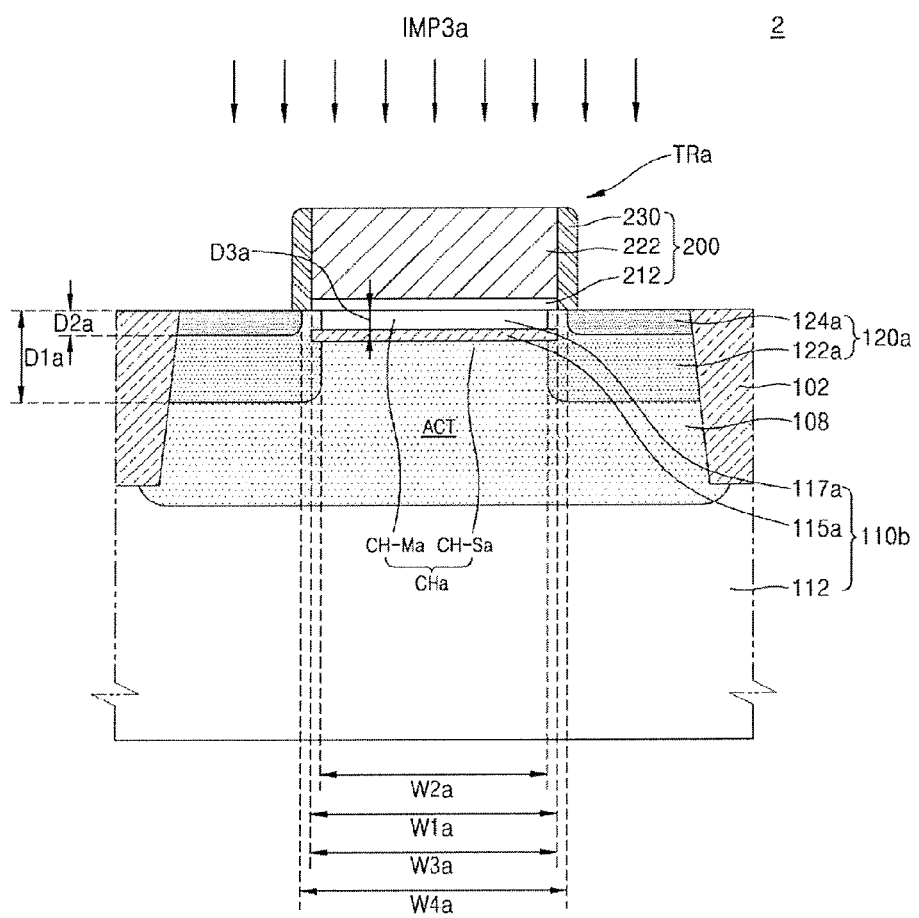

Referring to FIG. 19, a third ion implantation process IMP3a is performed, so that a second source/drain region 124a may be formed in a part of the first source/drain region 122a in the substrate 110b, and a semiconductor device 2 having a source/drain region 120a including the first source/drain region 122a and the second source/drain region 124a may be formed. In the third ion implantation process IMP3a, the second source/drain region 124a may be formed using gate structure 200 as an ion implantation mask.

The third ion implantation process IMP3a may be performed by implanting ions having second conductivity. That is, the second source/drain region 124a may have the same conductivity as that of the first source/drain region 122a. A level of a bottom surface of the second source/drain region 124a may be higher than a level of a bottom surface of the first source/drain region 122a with respect to the main surface of the substrate 110b. A doping concentration of the second source/drain region 124a may be greater than a doping concentration of the first source/drain region 122a.

The semiconductor device 2 includes the substrate 110b having the active region ACT including a channel region CHa, the gate structure 200 formed in the active region ACT including the channel region CHa, and the pair of source/drain regions 120a formed in the substrate 110b at both sides of the gate structure 200.

The substrate 110b includes the substrate base layer 112, the buried insulating patterns 115a disposed on the substrate base layer 112, and the semiconductor patterns 117a disposed on the buried insulating patterns 115a. The buried insulating patterns 115a may be formed in the substrate 110b and disposed in the channel region CHa at a lower side of the gate structure 200, so as to be spaced a predetermined distance from a top surface of the substrate 110b.

A part of the substrate base layer 112 and each of the semiconductor patterns 117a may constitute the channel region CHa. The channel region CHa may have first conductivity. The channel region CHa may include an upper channel region CH-Ma disposed on an upper side of each of the buried insulating patterns 115a and a lower channel region CH-Sa disposed on a lower side of each of the buried insulating patterns 115a, which are separated from each other by each of the buried insulating patterns 115a. The upper channel region CH-Ma may correspond to the semiconductor patterns 117a, and the lower channel region CH-Sa may be a part of the substrate base layer 112 at the lower side of each of the buried insulating patterns 115a. As described previously with reference to FIG. 3, ions implanted into the substrate 110 through the first ion implantation process IMP1 may be present mainly in a part of the substrate base layer 112, and a relatively small quantity of the ions may be implanted into the semiconductor layer 116 which is subsequently patterned to form the semiconductor patterns 117a. In addition, the buried insulating layer 114, which is subsequently patterned to form the buried insulating patterns 115a, may prevent the implanted ions from diffusing into the semiconductor layer 116 during thermal treatment. Thus, a doping concentration of the upper channel region CH-Ma may be less than that of the lower channel region CH-Sa.

The gate structure 200 may include a gate insulating layer 212 that covers a top surface of the active region ACT in which the channel region CHa is formed, a gate electrode 222 that covers the gate insulating layer 212 on the top surface of the active region ACT in which the channel region CHa is formed, and a pair of insulation spacers 230 formed on both sidewalls of the gate insulating layer 212 and the gate electrode 222. All of the buried insulating patterns 115a may overlap the gate electrode 222 in a direction perpendicular to the main surface of the substrate 110b.

The pair of source/drain regions 120a may be formed in the substrate 110b at both sides of each of the buried insulating patterns 115a, so as to extend from the top surface of the substrate 110b to a level lower than that of the buried insulating patterns 115a. The pair of source/drain regions 120a may have second conductivity that is different from the first conductivity. A part of each of the pair of source/drain regions 120a may overlap a part of the gate electrode 222 in a direction perpendicular to the main surface of the substrate 110b. A part of both ends of each of the buried insulating patterns 115a may be in contact with each of the pair of source/drain regions 120a. Thus, the upper channel region CH-Ma having the first conductivity may be surrounded by the buried insulating patterns 115a and the pair of source/drain regions 120a having the second conductivity, and separated from the lower channel region CH-Sa having the first conductivity. Thus, the upper channel region CH-Ma and the lower channel region CH-Sa may be electrically separated from each other.

Each of the source/drain regions 120a may include a first source/drain region 122a and a second source/drain region 124a. The second source/drain region 124a may have a doping concentration higher than that of the first source/drain region 122a. The first source/drain region 122a may extend more to the lower side of the gate electrode 122 than the second source/drain region 124a may extend. Also, a level of a bottom surface of the first source/drain region 122a may be lower than a level of a bottom surface of the second source/drain region 124a with respect to the main surface of the substrate 110b. Each of the opposite ends of the pair of second source/drain regions 124a of the pair of source/drain regions 120a may be located at a lower side of each of the insulation spacers 230. That is, a part of one end of the second source/drain region 124a may extend to the lower side of the gate structure 200.

A part of both ends of each of the buried insulating patterns 115a may be in contact with the first source/drain region 122a of each of the pair of source/drain regions 120a. In an exemplary embodiment of the inventive concept, a part of both ends of each of the buried insulating patterns 115a may be in contact with an upper portion of the first source/drain region 122a. That is, a part of both ends of each of the buried insulating patterns 115a may extend into the first source/drain region 122a. The buried insulating patterns 115a may be in contact with the first source/drain region 122a but may be spaced apart from the second source/drain region 124a.

Each of the buried insulating patterns 115a may have a first width W1a in a direction of a space between the pair of source/drain regions 120a. A distance between the pair of first source/drain regions 122a of the pair of source/drain regions 120a may have a second width W2a. The gate electrode 222 may have a third width W3a in the direction of the space between the pair of source/drain regions 120a. A distance between the pair of second source/drain regions 124a of the pair of source/drain regions 120a may have a fourth width W4a.

The first width W1a may be greater than the second width W2a. Thus, a part of both ends of each of the buried insulating patterns 115a may be in contact with the first source/drain region 122a and may extend into the first source/drain region 122a. The first width W1a may be smaller than the third width W3a. Thus, all of the buried insulating patterns 115a may overlap the gate electrode 222 in a direction perpendicular to the main surface of the substrate 110b. The first width W1a may be smaller than a fourth width W4a. Thus, each of the buried insulating patterns 115a may be spaced apart from the second source/drain region 124a.

The second width W2a may be smaller than the third width W3a. Thus, a part of the first source/drain region 122a may overlap a part of the gate electrode 222 in a direction perpendicular to the main surface of the substrate 110b. The second width W2a may be smaller than the fourth width W4a. Thus, the first source/drain region 122a may extend further to the lower side of the gate electrode 222 than the second source/drain region 124a may extend.

The third width W3a may be smaller than the fourth width W4a. Thus, a part of opposite ends of the pair of second source/drain regions 124a of the pair of source/drain regions 120a may extend to the lower side of the gate structure 200, and one end of the second source/drain region 124a may be located at a lower side of one of the pair of insulation spacers 230.

The first source/drain region 122a may have a first depth D1a from a top surface of the substrate 110b, and the second source/drain region 124a may have a second depth D2a that is smaller than the first depth D1a from the top surface of the substrate 110b. Thus, a level of a bottom surface of the first source/drain region 122a may be lower than a level of the bottom surface of the second source/drain region 124a with respect to the main surface of the substrate 110b.

Each of the buried insulating patterns 115a may have the third depth D3a from the top surface of the substrate 110b and may be disposed in the channel region CHa of the lower side of the gate electrode 222. Thus, the buried insulating patterns 115a may be spaced apart from the top surface of the substrate 110b.

The third depth D3a may be smaller than the first depth D1a. Thus, the source/drain region 120a, in particular, a bottom surface of the first source/drain region 122a may extend to a level lower than that of each of the buried insulating patterns 115a from the top surface of the substrate 110b.

The semiconductor device 2 may include a transistor TRa including the active region ACT in which the channel region CHa is formed, the gate insulating layer 212, the gate electrode 222, and the pair of source/drain regions 120a.

The channel region CHa of the transistor TRa may include an upper channel region CH-Ma disposed at an upper side of the buried insulating patterns 115a and a lower channel region CH-Sa disposed at a lower side of the buried insulating patterns 115a, which are separated from each other by the buried insulating patterns 115a. A part of both ends of each of the buried insulating patterns 115a may be in contact with each of the pair of source/drain regions 120a. Thus, the upper channel region CH-Ma may be surrounded by the buried insulating patterns 115a and the pair of source/drain regions 120a and separated from the lower channel region CH-Sa. Thus, the upper channel region CH-Ma and the lower channel region CH-Sa may be electrically separated from each other.

When the transistor TRa is turned on, portions of current that flows through the channel region CHa may flow together into the upper channel region CH-Ma and the lower channel region CH-Sa. Because a doping concentration of the upper channel region CH-Ma may be less than the doping concentration of the lower channel region CH-Sa, there may be relatively more portions of current that flow through the upper channel region CH-Ma having relatively higher mobility among the portions of current that flow through the channel region CHa. Thus, when the semiconductor device 2 has a plurality of transistors TRa, a difference in threshold voltages between transistors TRa may be reduced, so that mismatch of threshold voltages of the plurality of transistors TRa may be reduced.

Because the transistor TRa has both a current path of the channel region CH-Ma at the upper side of each of the buried insulating patterns 115a and a current path of the channel region CH-Sa at the lower side of each of the buried insulating patterns 115a, the entire current characteristics of the transistor TRa may be enhanced.

Because the first source/drain region 122a having a relatively low doping concentration has a bottom surface having a level which is lower than that of each of the buried insulating patterns 115a with respect to the main surface of the substrate 110b, on a condition that a drain bias voltage is high, an electric field applied to a drain of the channel region CHa may be dispersed into the upper channel region CH-Ma and the lower channel region CH-Sa along a depth of the first source/drain region 122a. Thus, the transistor TRa may have relatively high breakdown voltage characteristics.

In the semiconductor device 2 according to the current embodiment, due to the buried insulating patterns 115a that are locally disposed only at the lower side of the gate electrode 222 of the transistor TRa and not disposed at the other part of the source/drain region 120a than the lower side of the gate electrode 222, current characteristics having a high operating voltage of several V to several tens of V may be enhanced, and mismatch of threshold voltages may be reduced, and high breakdown voltage characteristics may be obtained.

Figure 20:
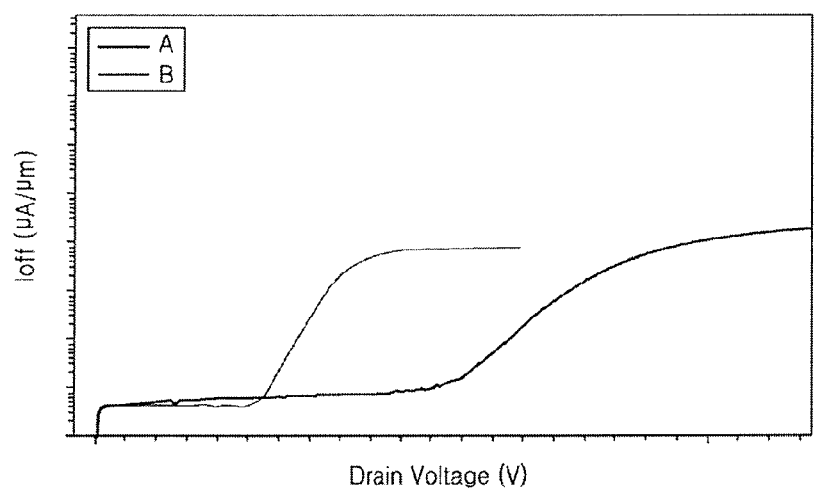
FIG. 20 is a graph showing a comparison between a breakdown voltage of a semiconductor device according to an exemplary embodiment of the inventive concept and a breakdown voltage of a semiconductor device in a comparative example.

FIG. 20 is a graph showing a comparison between a breakdown voltage of a semiconductor device according to an exemplary embodiment of the inventive concept and a breakdown voltage of a semiconductor device in a comparative example.

FIG. 20 is a graph showing a saturated-drain-source breakdown voltage (BVdss) of an off-state leakage current Ioff versus a drain voltage of a semiconductor device A according to an exemplary embodiment of the inventive concept and a drain voltage of a semiconductor device B in a comparative example.

The semiconductor device A according to the current embodiment includes buried insulating patterns that are locally disposed only at a lower side of a gate electrode and not disposed at the other part of a source/drain region than the lower side of the gate electrode. However, the semiconductor device B in the comparative example may include a buried insulating layer disposed at both the lower side of the gate electrode and the other part of the source/drain region than the lower side of the gate electrode.

The semiconductor device A according to the current embodiment shows off-state leakage current Ioff characteristics that are stable even at a relatively high drain voltage compared to the semiconductor device B in the comparative example. That is, in the semiconductor device A according to the current embodiment, due to buried insulating patterns, an electric field applied to a drain of a channel is dispersed into an upper channel region and a lower channel region so that the semiconductor device A according to the current embodiment may have a relatively high BVdss compared to the semiconductor device B in the comparative example.

Figure 21:
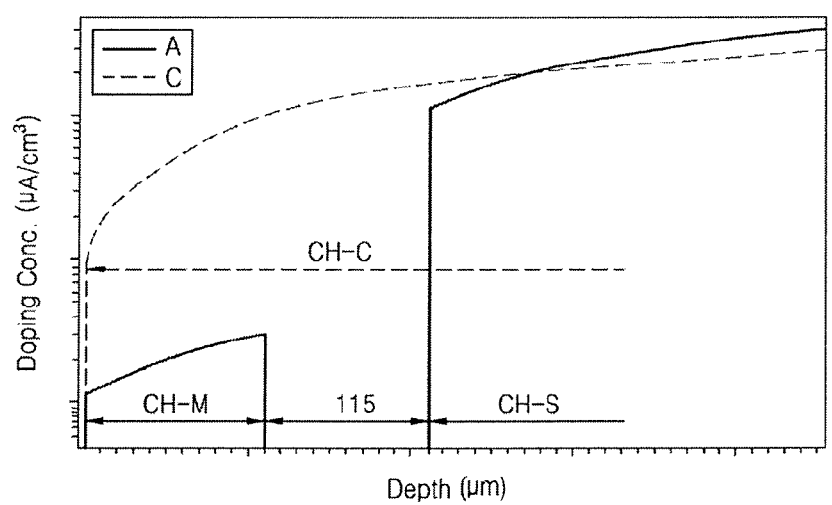
FIG. 21 is a graph showing a comparison between a doping profile of a semiconductor device according to an exemplary embodiment of the inventive concept and a doping profile of a semiconductor device in a comparative example.

FIG. 21 is a graph showing a comparison between a doping profile of a semiconductor device according to an exemplary embodiment of the inventive concept and a doping profile of a semiconductor device in a comparative example.

FIG. 21 is a graph showing a doping profile versus a depth direction from a main surface of a substrate in a channel region of the semiconductor device A according to an exemplary embodiment of the inventive concept and a depth direction from a main surface of a substrate in a channel region of the semiconductor device C in the comparative example.

The semiconductor device A according to the current embodiment has buried insulating patterns that are locally disposed only at a lower side of a gate electrode and not disposed at the other part of a source/drain region than the lower side of the gate electrode, but the semiconductor device C in the comparative example may not have these buried insulating patterns.

In the semiconductor device A according to the current embodiment, an upper channel region CH-M, buried insulating patterns 115, and a lower channel region CH-S are disposed in a depth direction from a main surface of a substrate. Because, due to the buried insulating patterns 115, the amount of ions implanted into the upper channel region CH-M is less than the amount of ions implanted into the lower channel region CH-S, and ions from the lower channel region CH-S may not be dispersed to the upper channel region CH-M during thermal treatment, the doping concentration of the upper channel region CH-M may be less than the doping concentration of the lower channel region CH-Sa by at least about 1.5 to 2 order or more.

Because the semiconductor device C in the comparative example does not have elements corresponding to the buried insulating patterns, a difference in doping concentration in a channel region CH-C may not be relatively large in the depth direction from the main surface of the substrate.

When the semiconductor device A according to the current embodiment has a plurality of transistors, a difference in threshold voltage between transistors may be reduced so that mismatch of threshold voltages of the plurality of transistors may be reduced.

Figure 22:
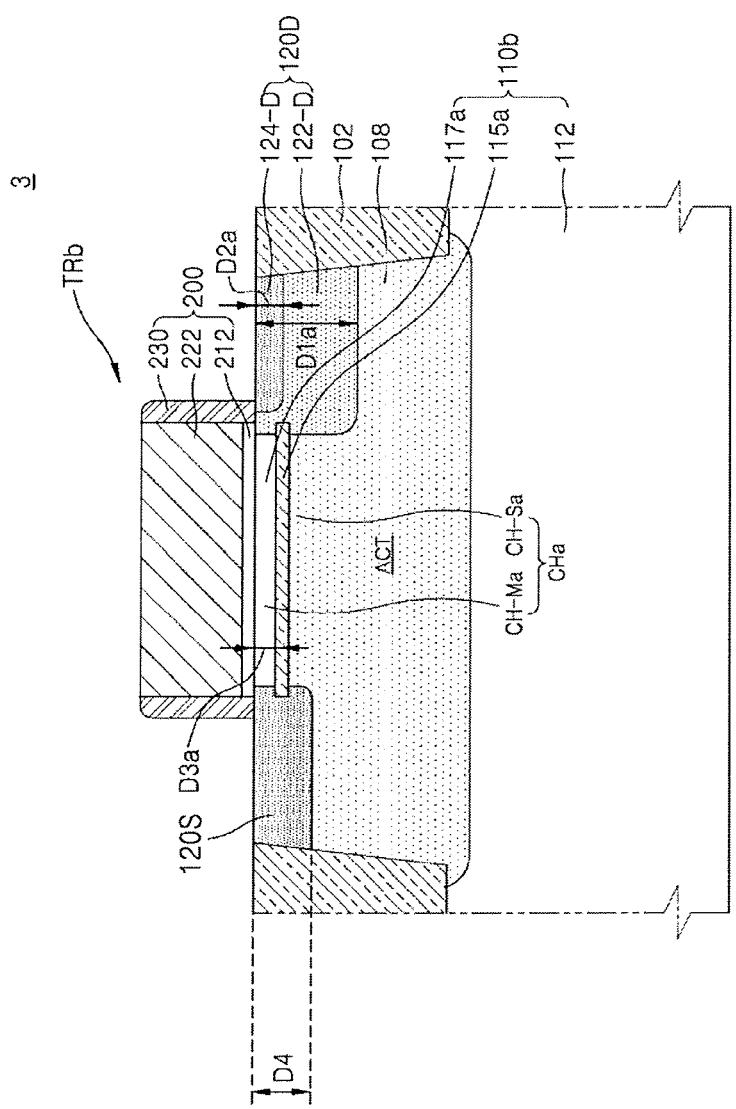
FIG. 22 is a cross-sectional view of a main configuration of a semiconductor device according to an exemplary embodiment of the inventive concept.

FIG. 22 is a cross-sectional view of a main configuration of a semiconductor device according to an exemplary embodiment of the inventive concept. In FIG. 22, same reference numerals as those of FIGS. 12 through 19 represent same elements, and in the description that follows, redundant descriptions of these elements may be omitted.

Referring to FIG. 22, a semiconductor device 3 includes a substrate 110b having an active region ACT including a channel region CHa, a gate structure 200 in the active region ACT including the channel region CHa, and a source region 120S and a drain region 120D, which are respectively formed in the substrate 110b at both sides of the gate structure 200.

The semiconductor device 2 illustrated in FIG. 19 includes a pair of source/drain regions 120a formed in the substrate 110b at both sides of the gate structure 200 that are symmetric to each other. That is, the source region and the drain region of the pair of source/drain regions 120a have the same size and shape at opposite sides of the gate structure 200. The semiconductor device 3 illustrated in FIG. 22 includes a gate structure 200, and a source region 120S and a drain region 120D formed in the substrate 110b at both sides of the gate structure 200 that are asymmetric to each other. That is, the source region 120S and the drain region 120D formed in the substrate 110b have different size and/or shape at opposite sides of the gate structure 200. The drain region 120D may include a first drain region 122D and a second drain region 124D.

The drain region 120D of the semiconductor device 3 illustrated in FIG. 22, and the first drain region 122D and the second drain region 124D that constitute the drain region 120D have structures the same as those of one source/drain region 120a at one side of the semiconductor device 2 illustrated in FIG. 19, and a first source/drain region 122a and a second source/drain region 124a that constitute the source/drain region 120a, and thus, detailed descriptions thereof will be omitted.

The source region 120S and the second drain region 124D have the same conductivity, and may have same or similar doping concentration.

A part of one end of each of the buried insulating patterns 115a may be in contact with the source region 120S, and a part of the other end of each of the buried insulating patterns 115a may be in contact with the first drain region 122D, respectively. A part of one end of each of the buried insulating patterns 115a may extend into the source region 120S, and a part of the other end of each of the buried insulating patterns 115a may extend into the first drain region 122D, respectively. Each of the buried insulating patterns 115a may be in contact with the first drain region 122D but may be spaced apart from the second drain region 124D.

The first drain region 122D may extend further to the lower side of the gate electrode 122 than the second drain region 124D may extend. Opposite ends of the source region 120S and the first drain region 122D may be located at the lower side of the gate electrode 122. One end of the second drain region 124D toward the source region 120S may be located at lower side of the insulation spacer 230. That is, a part of one end of the second drain region 124D may extend to the lower side of the gate structure 200.

The first drain region 122D may have a first depth D1a from a top surface of the substrate 110a, and the second drain region 124D may have a second depth D2a from the top surface of the substrate 110b. Thus, a level of a bottom surface of the first drain region 122D may be lower than a level of a bottom surface of the second drain region 124D with respect to the main surface of the substrate 110b.

The source region 120S may have a fourth depth D4 from the top surface of the substrate 110b. In an exemplary embodiment of the inventive concept, the fourth depth D4 may be greater than the second depth D2a, but is not limited thereto.

The semiconductor device 3 may be formed by performing an additional ion implantation process on the source region 120S, the first drain region 122D, and the second drain region 124D, respectively. The first drain region 122D may be formed before the insulation spacers 230 are formed, and the second drain region 124D may be formed after the insulation spacers 230 are formed. The source region 120S may be formed before the insulation spacers 230 are formed.

Because, in the semiconductor device 3, the first drain region 122D having a relatively low doping concentration has a bottom surface having a level which is lower than a level of each of the buried insulating patterns 115a with respect to the main surface of the substrate 110b, on a condition that a drain bias voltage is high, an electric field applied to a drain of the channel region CHa may be dispersed into the upper channel region CH-Ma and the lower channel region CH-Sa along the depth of the first drain region 122D. Thus, the transistor TRb may have relatively high breakdown voltage (for example, BVdss) characteristics. In addition, mismatch of threshold voltages in the semiconductor device 3 may be reduced, as described with reference to FIG. 19. The entire current characteristics may be enhanced.

FIG. 22 illustrates a case where the semiconductor device 3 has the buried insulating patterns 115a illustrated in FIG. 19. However, exemplary embodiments of the inventive concept are not limited thereto, and the semiconductor device 3 of FIG. 22 may have the buried insulating patterns 115a illustrated in FIG. 11.

Figure 23:
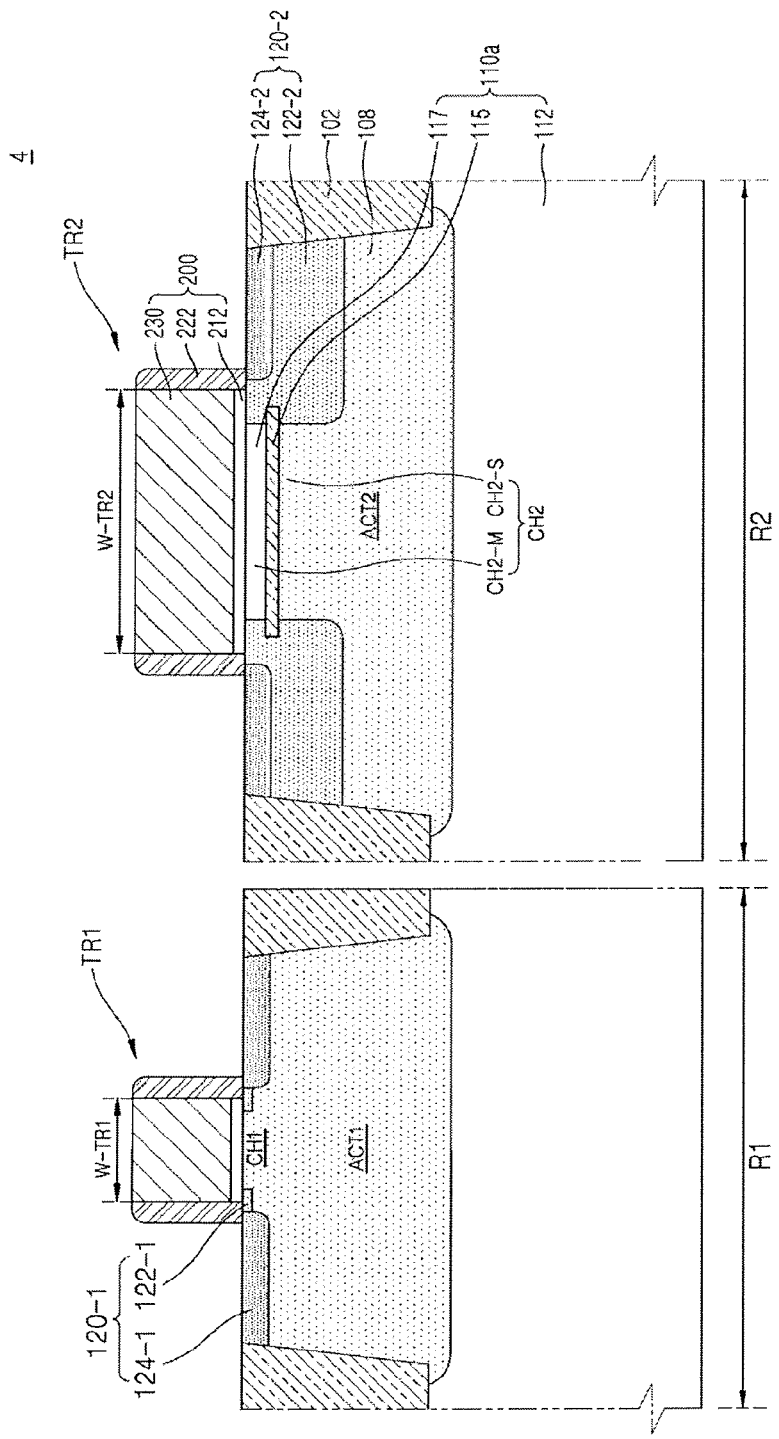
FIG. 23 is a cross-sectional view of a main configuration of a semiconductor device according to an exemplary embodiment of the inventive concept.

FIG. 23 is a cross-sectional view of a main configuration of a semiconductor device according to an exemplary embodiment of the inventive concept. In FIG. 23, same reference numerals as those of FIGS. 1 through 22 represent same elements, and in the description that follows, redundant descriptions of these elements may be omitted.

Referring to FIG. 23, a semiconductor device 4 includes a substrate 110a including a first region R1 and a second region R2. A first transistor TR1 having a first active region ACT1 formed therein may be formed in the first region R1, and a second transistor TR2 having a second active region ACT2 formed therein may be formed in the second region R2.

The second transistor TR2 formed in the second region R2 may have a structure the same as that of the transistor TR illustrated in FIG. 11. However, although not additionally shown, the transistor TRa illustrated in FIG. 19 or the transistor TRb illustrated in FIG. 22 may also be formed in the second region R2.

A width W-TR1 of the gate electrode 222 of the first transistor TR1 may be smaller than a width W-TR2 of the gate electrode 222 of the second transistor TR2.

Buried insulating patterns 115 are disposed at the lower side of the gate electrode 222 of the second transistor TR2. However, no similar element is disposed in the first transistor TR1. Thus, unlike in the second transistor TR2 including the upper channel region CH2-M and the lower channel region CH2-S separated from each other in the second active region ACT2, a channel region CH1 formed in the first active region ACT1 of the first transistor TR1 may not be separated to an upper channel region and a lower channel region. That is, the second active region ACT2 is discontinuously disposed from the top surface of the substrate 110a to a level of a bottom surface of the isolation layer 102 due to the buried insulating patterns 115. However, the first active region ACT1 may extend from the top surface of the substrate 110a to the level of the bottom surface of the isolation layer 102.

The first transistor TR1 includes a pair of source/drain regions 120-1 formed in the substrate 110a at both sides of the gate electrode 222. Each of the pair of source/drain regions 120-1 of the first transistor TR1 may include a first source/drain region 122-1 and a second source/drain region 124-1 having a doping concentration higher than that of the first source/drain region 122-1. Because the first source/drain region 122-1 has a relatively low doping concentration and the second source/drain region 124-1 has a relatively high doping concentration, the first source/drain region 122-1 and the second source/drain region 124-1 may be referred to as a low concentration source/drain region 122-1 and a high concentration source/drain region 124-1, respectively.

The second transistor TR2 includes a pair of source/drain regions 120-2 formed in the substrate 110a at both sides of the gate electrode 222. The source/drain region 120-2 of the second transistor TR2 may include a first source/drain region 122-2 and a second source/drain region 124-2 having a doping concentration higher than that of the first source/drain region 122-2. Because the first source/drain region 122-2 has a relatively low doping concentration and the second source/drain region 124-2 has a relatively high doping concentration, the first source/drain region 122-2 and the second source/drain region 124-2 may be referred to as a low concentration source/drain region 122-2 and a high concentration source/drain region 124-2.

A level of a bottom surface of the second source/drain region 124-2 of the second transistor TR2 may be higher than a level of a bottom surface of the first source/drain region 122-2 with respect to the main surface of the substrate 110a. However, a level of the bottom surface of the second source/drain region 124-1 of the first transistor TR1 may be lower than a level of the bottom surface of the first source/drain region 122-1 with respect to the main surface of the substrate 110a. In an exemplary embodiment of the inventive concept, the level of the bottom surface of the second source/drain region 124-1 of the first transistor TR1 and the level of the bottom surface of the second source/drain region 124-2 of the second transistor TR2 may be the same. However, exemplary embodiments of the inventive concept are not limited thereto.

The first transistor TR1 may be a transistor for a logic device or memory device. The second transistor TR2 may be a transistor for a voltage generator for generating a high voltage.

Because the second transistor TR2 has the buried insulating patterns 115, mismatch of threshold voltages may be reduced, and current characteristics may be enhanced. In addition, the second transistor TR2 may have relatively high breakdown voltage (for example, BVdss) characteristics. Thus, the second transistor TR2 may enable the voltage generator to generate a high and stable operating voltage.

FIGS. 24A through 24D are cross-sectional views illustrating an operation of processing a substrate according to an exemplary embodiment of the inventive concept. FIGS. 24A through 24D are cross-sectional views for explaining the operation of processing the substrate in a first region R1 and a second region R2 by omitting most steps of an operation of manufacturing transistors TR1 and TR2 in the method of manufacturing the semiconductor device 4 illustrated in FIG. 23.

Figure 24A:
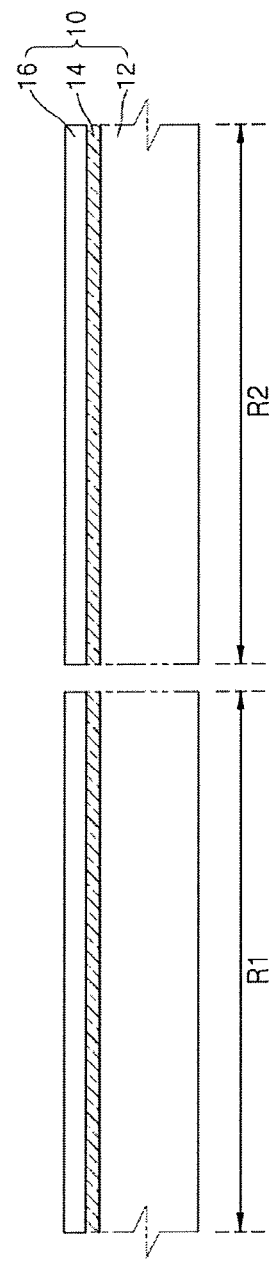
FIGS. 24A through 24D are cross-sectional views illustrating an operation of processing a substrate according to an exemplary embodiment of the inventive concept.

Referring to FIG. 24A, a substrate 10 having a first region R1 and a second region R2 is prepared. The substrate 10 includes a substrate base layer 12, a buried insulating layer 14 that covers the substrate base layer 12, and a semiconductor layer 16 that covers the buried insulating layer 14. The substrate 10 may have an SOI structure. That is, the substrate 10 may include the buried insulating layer 14 between the substrate base layer 12 and the semiconductor layer 16. The substrate 10 may be a prepared SOI wafer.

Figure 24B:
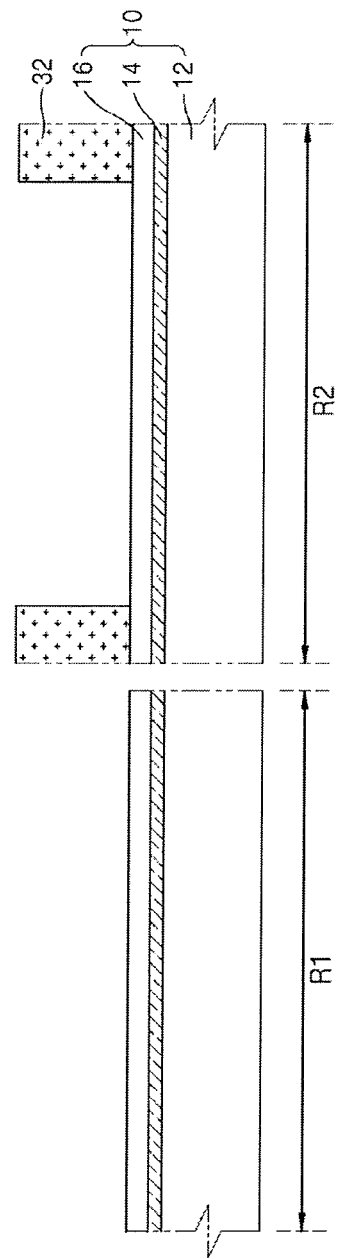

Referring to FIG. 24B, a mask layer 32 that covers a part of the second region R2 is formed on the substrate 10. The mask layer 32 may include, for example, a photoresist layer. The photoresist layer may be formed by a lithographic process.

Figure 24C:
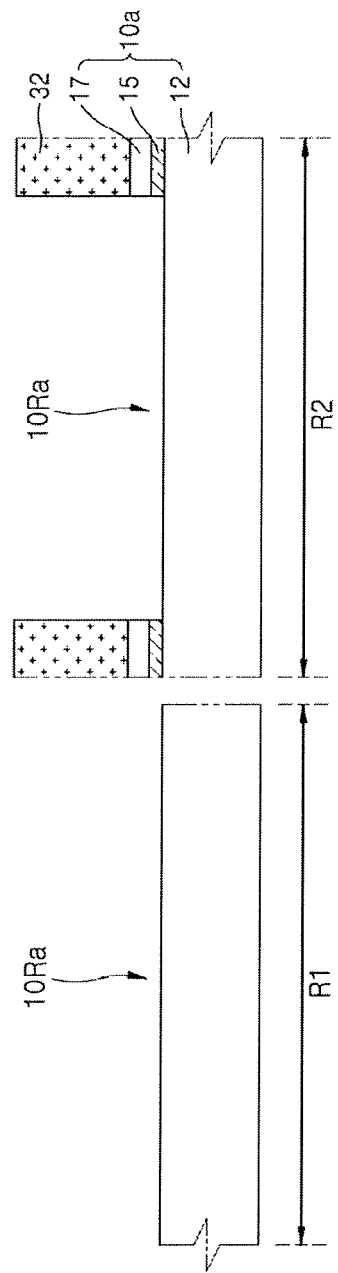

Referring to FIGS. 24B and 24C together, a part of each of the semiconductor layer 16 and the buried insulating layer 14 is removed using the mask layer 32 as an etching mask, so that a recess space 10Ra in which a part of the substrate base layer 12 is exposed, may be formed. The other part of each of the semiconductor layer 16 and the buried insulating layer 14 in the second region R2 may remain as semiconductor patterns 17 and buried insulating patterns 15 on the substrate base layer 12. All of the semiconductor layer 16 and the buried insulating layer 14 may be removed from the first region R1.

Figure 24D:
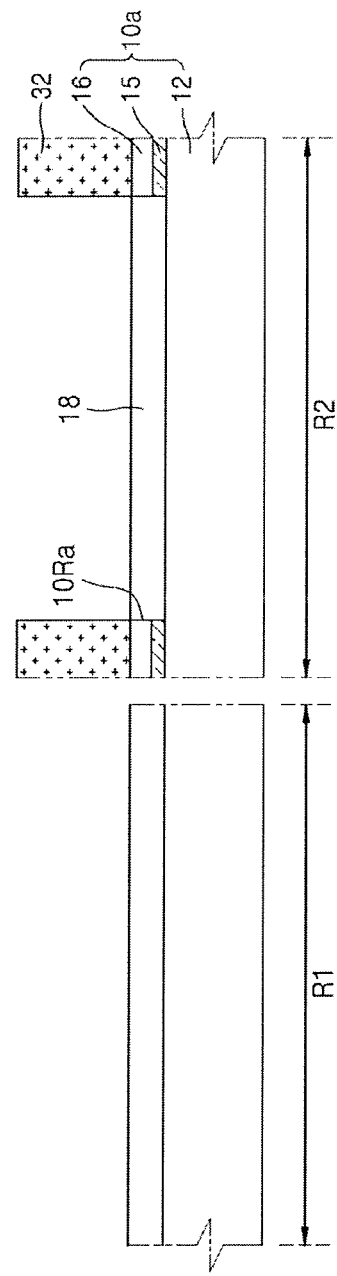

Referring to FIG. 24D, an SEG process in which the surface of the substrate base layer 12 exposed by the recess space 10Ra is used as a seed, is performed so that an epitaxial semiconductor layer 18 for filling the recess space 10Ra may be formed. Thus, the buried insulating patterns 15 may be formed only in a part of the second region R2.

Descriptions of the second region R2 for the operation of processing the substrate illustrated in FIGS. 24A through 24D may be applied to an operation of processing a substrate for manufacturing the semiconductor device 1, 2 or 3 illustrated in FIGS. 1 through 22.

FIGS. 25A through 25E are cross-sectional views illustrating an operation of processing a substrate according to an exemplary embodiment of the inventive concept. FIGS. 25A through 25E are cross-sectional views illustrating the operation of processing the substrate in a first region R1 and a second region R2 in a state in which most steps of an operation of manufacturing transistors TR1 and TR2 are omitted from the method of manufacturing the semiconductor device 4 illustrated in FIG. 23.

Figure 25A:
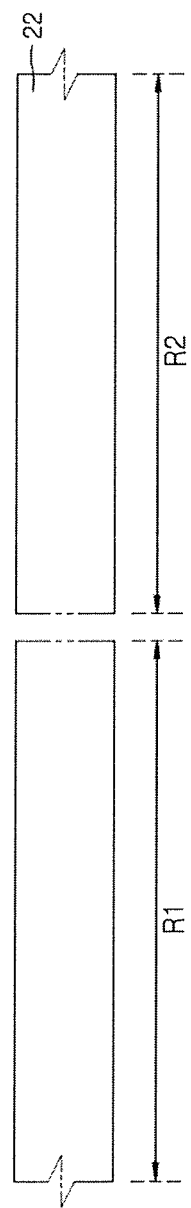
FIGS. 25A through 25E are cross-sectional views illustrating an operation of processing a substrate according to an exemplary embodiment of the inventive concept.

Referring to FIG. 25A, a substrate base layer 22 is prepared. The substrate base layer 22 may be a prepared semiconductor wafer.

Figure 25B:
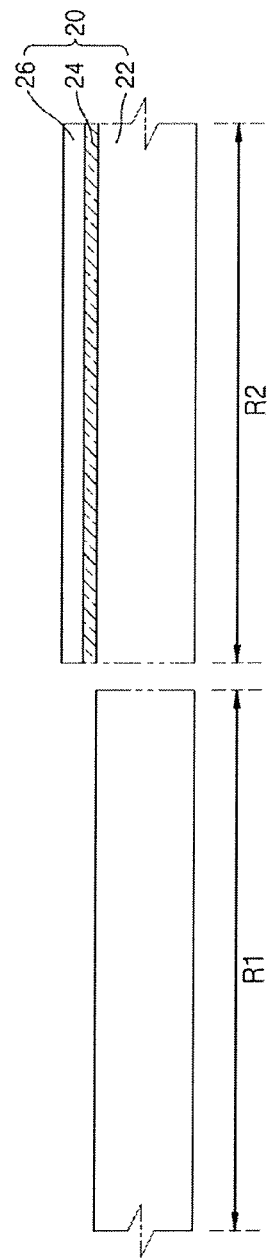

Referring to FIG. 25B, a buried insulating layer 24 and a semiconductor layer 26 are selectively formed only in the second region R2, so that a substrate 20 may be prepared. Only the substrate base layer 22 may be present in the first region R1 of the substrate 20, and the buried insulating layer 24 and the semiconductor layer 26 that are sequentially formed on the substrate base layer 22 may be further present in the second region R2 of the substrate 20.

Figure 25C:
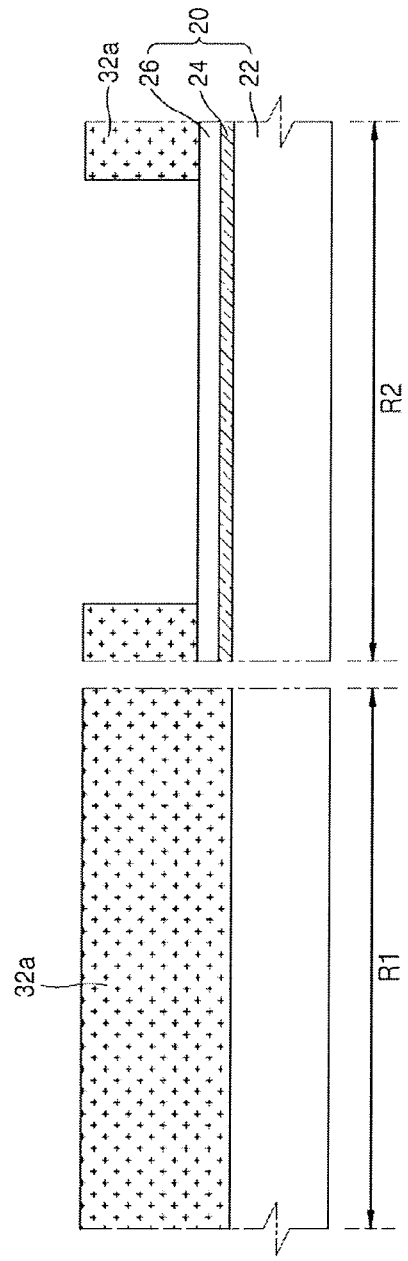

Referring to FIG. 25C, a mask layer 32a that covers all of the first region R1 and a part of the second region R2 is formed on the substrate 20.

Figure 25D:
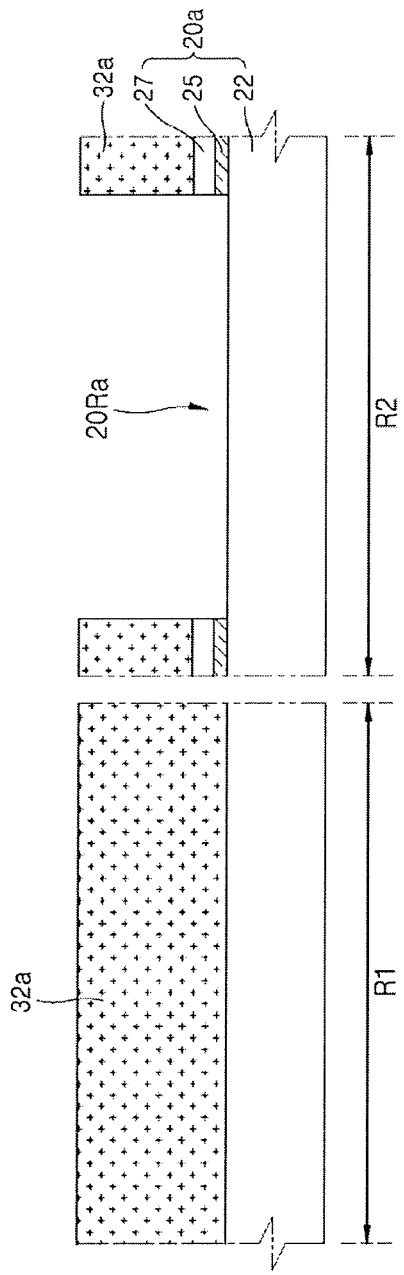

Referring to FIGS. 25C and 25D together, a part of each of the semiconductor layer 26 and the buried insulating layer 24 is removed using the mask layer 32a as an etching mask, so that a recess space 20Ra in which a part of the substrate base layer 22 is exposed, may be formed. The other part of each of the semiconductor layer 26 and the buried insulating layer 24 in the second region R2 may remain as semiconductor patterns 27 and buried insulating patterns 25 on the substrate base layer 22. Subsequently, a part of the mask layer 32a formed in the first region R1 may be removed.

Figure 25E:
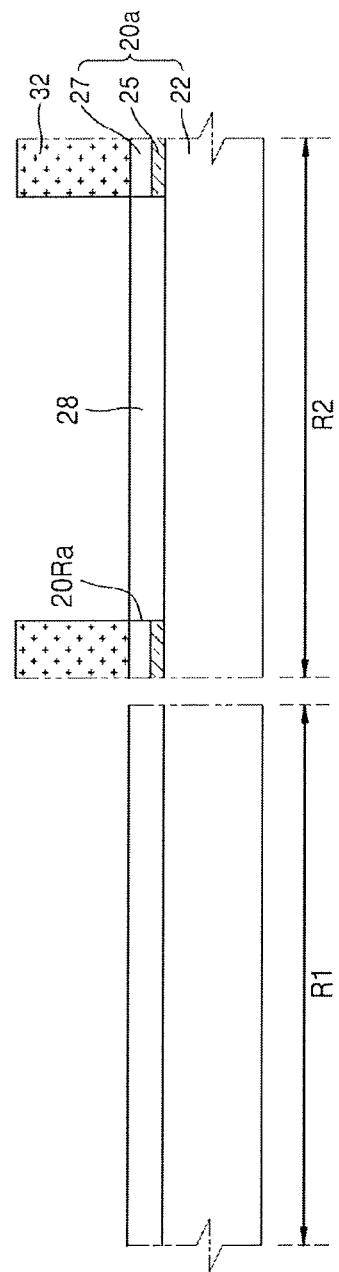

Referring to FIG. 25E, an SEG process in which the surface of the substrate base layer 22 exposed by the recess space 20Ra is used as a seed, is performed, so that an epitaxial semiconductor layer 28 that covers all of the substrate base layer 22 of the first region R1 and fills the recess space 20Ra of the second region R2 may be formed. Thus, the buried insulating patterns 25 may be formed only in a part of the second region R2.

Descriptions of the second region R2 for the operation of processing the substrate illustrated in FIGS. 25A through 25D may be applied to the operation of processing the substrate for manufacturing the semiconductor device 1, 2 or 3 described with reference to FIGS. 1 through 22.

Figure 26:
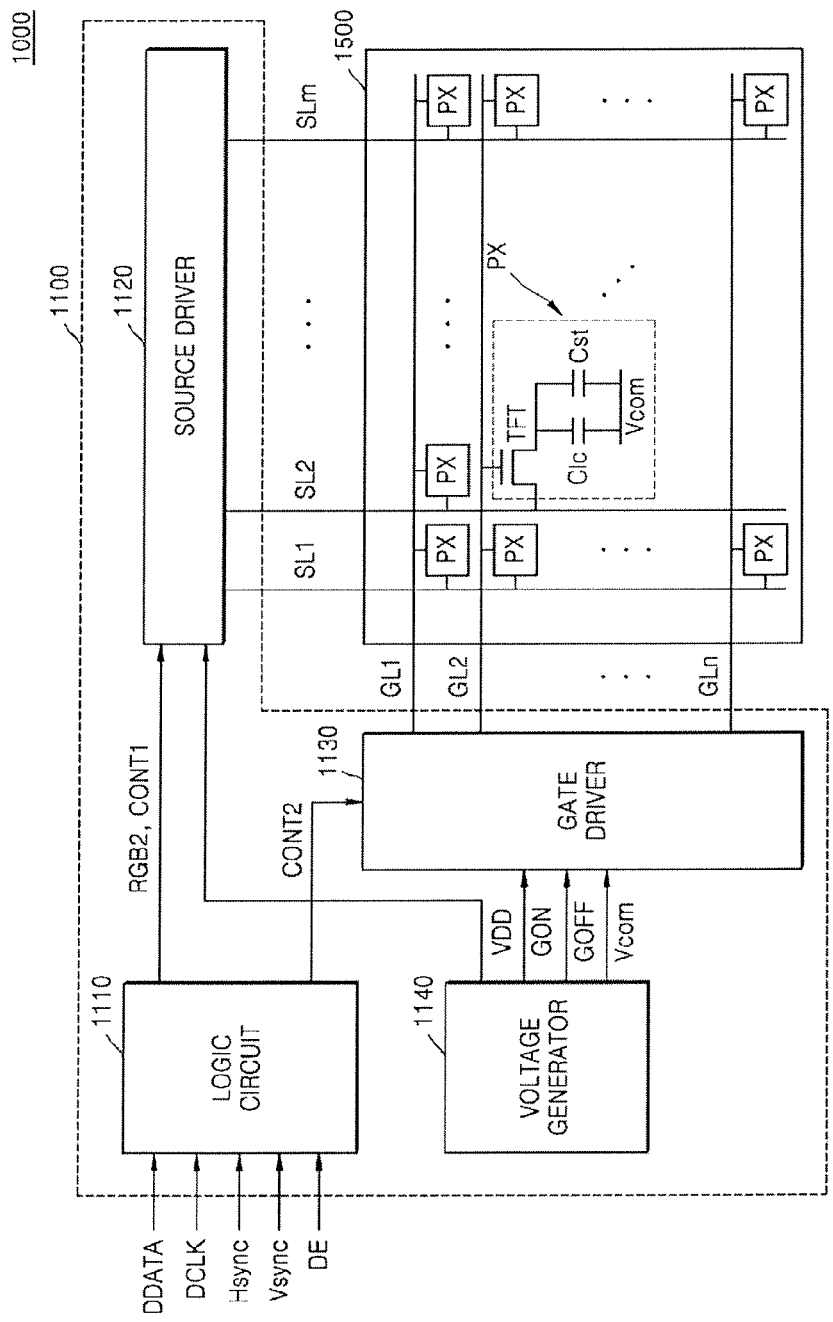
FIG. 26 is a block diagram of a display apparatus according to an exemplary embodiment of the inventive concept.

FIG. 26 is a block diagram of a display apparatus according to an exemplary embodiment of the inventive concept.

Referring to FIG. 26, a display apparatus 1000 includes a display panel 1500 and a display driving circuit 1100.

An image in units of a frame is displayed on the display panel 1500. The display panel 1500 may be implemented as, for example, a liquid crystal display (LCD), a light emitting diode (LED) display, an organic LED (OLED) display, an active-matrix OLED (AMOLED) display, or a flexible display. Also, the display panel 1500 may be implemented as different types of flat displays. For conveniences of explanation, when describing the inventive concept, an LCD panel will be described.

The display panel 1500 includes gate lines GL1 to GLn arranged in a row direction, source lines SL1 to SLm arranged in a column direction, and pixels PX formed at a crossing point of the gate lines GL1 to GLn and the source lines SL1 to SLm. In the LCD panel, the pixels PX include a thin film transistor (TFT), a liquid crystal capacitor Clc and a storage capacitor Cst connected to a drain of the TFT, as illustrated. A common voltage Vcom may be connected to the other ends of the liquid crystal capacitor Clc and the storage capacitor Cst. When the gate lines GL1 to GLn are sequentially scanned, the TFT of the pixels PX connected to the selected gate line is turned on, and subsequently, a gray voltage corresponding to display data RGB is applied to each of the source lines SL1 to SLm. RGB may represent red, green and blue, and it may be a color model used to display colors on different types of displays. The gray voltage is applied to the liquid crystal capacitor Clc and the storage capacitor Cst via the TFT of the pixels PX, and the liquid crystal and the storage capacitors Clc and Cst are driven so that a display operation may be performed.

The display driving circuit 1100 may include a source driver 1120, a gate driver 1130, a logic circuit 1110, and a voltage generator 1140.

The display driving circuit 1100 may be implemented as one semiconductor chip or a plurality of semiconductor chips.

The logic circuit 1110 may receive display data DDATA, a horizontal synchronization signal Hsync, a vertical synchronization signal Vsync, a clock signal DCLK, and a data enable signal DE from an external device (for example, a host device), and may generate control signals BSS (bias selection signal), CONT1, and CONT2 for controlling the gate driver 1130 and the source driver 1120 based on the received signals. Also, the logic circuit 1110 may generate the display data DDATA received from the outside as display data RGB generated by converting a format of the display data DDATA to be suitable for an interface specification with the source driver 1120 and may transmit the generated display data RGB to the source driver 1120. The logic circuit 1110 may include, for example, an interface unit, a selector, and a timing controller. Also, the logic circuit 1110 may include memory for storing the received display data RGB.

The gate driver 1130 and the source driver 1120 drive the pixels PX of the display panel 1500 in response to the control signals CONT1 and CONT2 provided by the logic circuit 1110.

The source driver 1120 drives the source lines SL1 to SLm of the display panel 1500 based on the source driver control signal CONT1. The gate driver 1130 scans the gate lines GL1 to GLn of the display panel 1500 sequentially. The gate driver 1130 activates gate lines selected by applying a gate-on voltage GON to the selected gate lines, and the source driver 1120 outputs gray voltages corresponding to the pixels PX connected to the activated gate lines. Thus, an image in units of a horizontal line, i.e., in one row may be displayed on the display panel 1500.

The voltage generator 1140 generates voltages used in the display driving circuit 1100 and the display panel 1500. The voltage generator 1140 may generate, for example, a gate-on voltage GON, a gate-off voltage GOFF, a common voltage Vcom, an analog power supply voltage VDDA, and the like. The gate-on voltage GON and the gate-off voltage GOFF are provided to the gate driver 1130 and are used to generate gate signals applied to the gate lines G1 to Gn. The common voltage Vcom may be commonly provided to the pixels PX of the display panel 1500. As illustrated, the common voltage Vcom may be provided to one end of the liquid crystal capacitor Clc and one end of the storage capacitor Cst. The analog power supply voltage VDDA may be used when the source driver 1120 operates.

The voltage generator 1140 includes at least one of the semiconductor devices 1, 2, and 3 described with reference to FIGS. 1 through 25 and semiconductor devices manufactured by various manufacturing methods modified and changed from the semiconductor devices 1, 2, and 3 within the scope and technical spirit of the inventive concept.

The display driving circuit 1100 includes at least one of the semiconductor devices 1, 2, 3, and 4 described with reference to FIGS. 1 through 25 and semiconductor devices manufactured by various manufacturing methods modified or changed from the semiconductor devices 1, 2, 3, and 4 within the scope and technical spirit of the inventive concept. In an exemplary embodiment of the inventive concept, the voltage generator 1140 of the display driving circuit 1100 may include at least one of the semiconductor devices 1, 2, and 3, or the second region R2 of the semiconductor device 4 described with reference to FIGS. 1 through 25 and the first region R1 of the semiconductor device 4 in the other part of the voltage generator 1140.

Figure 27:
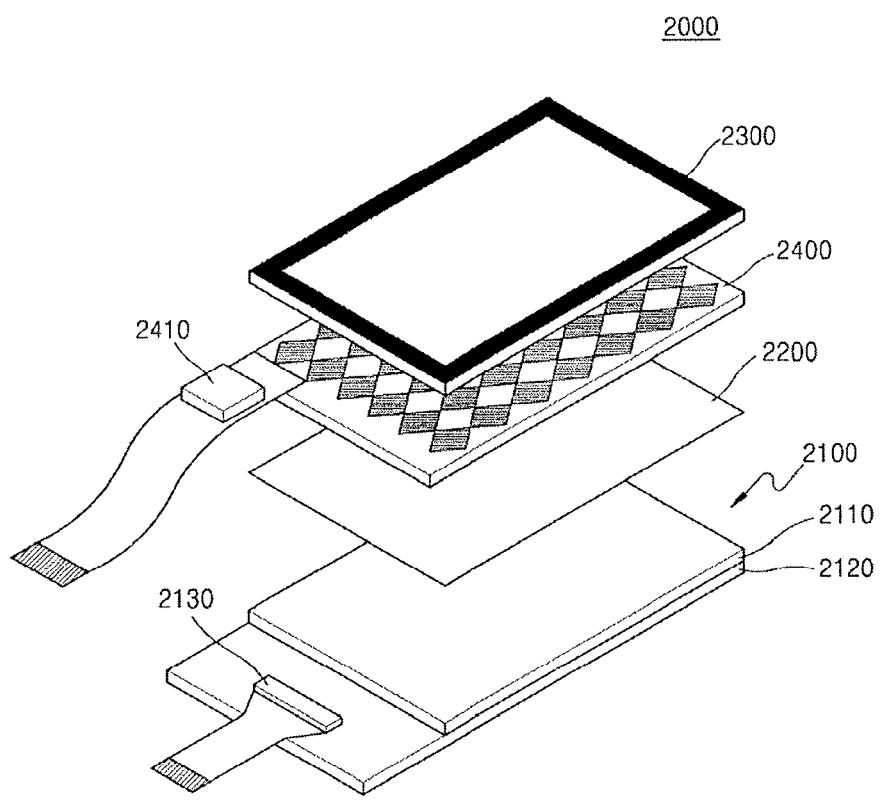
FIG. 27 is a view of a display module according to an exemplary embodiment of the inventive concept.

FIG. 27 is a view of a display module according to an exemplary embodiment of the inventive concept.

Referring to FIG. 27, the display module 2000 may include a display apparatus 2100, a polarizer 2200, and a window glass 2300. The display apparatus 2100 may include a display panel 2110, a printed board 2120, and a display driving integrated circuit (IC) 2130.

The window glass 2300 is manufactured of a material, such as acryl or reinforced glass and protects the display module 2000 from scratch caused by external shock or repetitive touch. The polarizer 2200 may be provided to enhance optical characteristics of the display panel 2100. The display panel 2110 may be formed by patterning a transparent electrode on the printed board 2120. The display panel 2110 includes a plurality of pixels for displaying a frame. In an exemplary embodiment of the inventive concept, the display module 2110 may be a liquid crystal panel. However, exemplary embodiments of the inventive concept are not limited thereto, and the display panel 2110 may include various types of display devices. For example, the display module 2110 may be one from among an organic light emitting diode (OLED), an electrochromic display (ECD), a digital mirror device (DMD), an actuated mirror device (AMD), a grating light value (GLV), a plasma display panel (PDP), an electro luminescent display (ELD), a light emitting diode (LED) display, and a vacuum fluorescent display (VFD).

In the current embodiment, the display driving IC 2130 is illustrated as one chip. However, this is just for convenience of illustration, and the display driving IC 2130 may be mounted as a plurality of chips. Also, the display driving IC 2130 may be mounted in the form of a chip on glass (COG) on a printed board formed of a glass material. However, this is just an exemplary embodiment, and the display driving IC 2130 may be mounted in various forms, such as in the form of a chip on film (COF), a chip on board (COB), and the like.

The display driving IC 2130 includes at least one of the semiconductor devices 1, 2, 3, and 4 described with reference to FIGS. 1 through 25 and semiconductor devices manufactured by various manufacturing methods modified and changed from the semiconductor devices 1, 2, 3, and 4 within the scope and technical spirit of the inventive concept.

The display module 2000 may further include a touch panel 2400 and a touch controller 2410. The touch panel 2400 may be formed by patterning a transparent electrode, such as an indium tin oxide (ITO), on a glass substrate or a polyethylene terephthalate (PET) film. The touch controller 2410 detects occurrence of touch on the touch panel 2400, calculates touch coordinates and delivers the calculated touch coordinates to a host. The touch controller 2410 may also be integrated on the display driving IC 2130 and one semiconductor chip.

While the inventive concept has been particularly shown and described with reference to the specific exemplary embodiments thereof, it will be understood that various changes in form and details may be made therein without departing from the spirit and scope of the following claims.

What is claimed is:

1. A semiconductor device comprising:
   a substrate having an active region including a channel region;
   a gate insulating layer that covers a top surface of the active region;
   a gate electrode that covers the gate insulating layer on the top surface of the active region;
   buried insulating patterns in the channel region of the active region at a lower side of the gate electrode and spaced apart from a top surface of the substrate; and
   a pair of source/drain regions in the substrate at both sides of each of the buried insulating patterns and extending from the top surface of the substrate to a level lower than that of each of the buried insulating patterns,
   wherein each of the pair of source/drain regions comprises a first source/drain region and a second source/drain region having a doping concentration higher than that of the first source/drain region, and
   the first source/drain region extends further to a lower side of the gate electrode than the second source/drain region extends.

2. The semiconductor device of claim 1, wherein all of the buried insulating patterns overlap the gate electrode in a direction perpendicular to a main surface of the substrate.

3. The semiconductor device of claim 2, wherein a width of each of the buried insulating patterns is equal to a width of the gate electrode between the pair of source/drain regions.

4. The semiconductor device of claim 2, wherein a width of each of the buried insulating patterns is smaller than a width of the gate electrode between the pair of source/drain regions.

5. The semiconductor device of claim 1, wherein a part of both ends of each of the buried insulating patterns is in contact with each of the pair of source/drain regions.

6. The semiconductor device of claim 1, wherein a level of a bottom surface of the first source/drain region is lower than a level of a bottom surface of the second source/drain region with respect to a main surface of the substrate.

7. The semiconductor device of claim 1, wherein a part of both ends of each of the buried insulating patterns is in contact with the first source/drain region of each of the pair of source/drain regions.

8. The semiconductor device of claim 1, wherein the channel region comprises an upper channel region at an upper side of each of the buried insulating patterns, and a lower channel region at a lower side of each of the buried insulating patterns, the upper channel region and the lower channel region being separated from each other by the buried insulating patterns.

9. A semiconductor device comprising:
a substrate comprising a first region, a second region, and an isolation layer, the isolation layer defining an active region including a channel region;
a gate insulating layer that covers a top surface of the active region in each of the first region and the second region;
a gate electrode that covers the gate insulating layer on the top surface of the active region in each of the first region and the second region;
buried insulating patterns in the channel region of the active region at a lower side of the gate electrode and spaced apart from a top surface of the substrate in the second region;
a pair of first source/drain regions in the substrate at both sides of the gate electrode in the first region; and
a pair of second source/drain regions in the substrate at both sides of each of the buried insulating patterns and extending from the top surface of the substrate to a level lower than that of each of the buried insulating patterns in the second region,
wherein, in the first region, the active region extends from the top surface of the substrate to a bottom surface of the isolation layer.

10. The semiconductor device of claim 9, wherein a width of each of the buried insulating patterns is equal to or smaller than a width of the gate electrode in the second region between the pair of second source/drain regions.

11. The semiconductor device of claim 9, wherein all of the buried insulating patterns overlap the gate electrode in the second region in a direction perpendicular to a main surface of the substrate.

12. The semiconductor device of claim 9, wherein each of the pair of second source/drain regions comprises a second low concentration source/drain region and a second high concentration source/drain region having a doping concentration higher than that of the second low concentration source/drain region, and
a part of both ends of each of the buried insulating patterns is in contact with the second low concentration source/drain region of each of the pair of second source/drain regions, and
each of the buried insulating patterns is spaced apart from the second high concentration source/drain region.

13. The semiconductor device of claim 12, wherein the second low concentration source/drain region extends further to a lower side of the gate electrode than the second high concentration source/drain region extends, and a level of a bottom surface of the second low concentration source/drain region is lower that a level of a bottom surface of the second high concentration source/drain region with respect to a main surface of the substrate.

14. The semiconductor device of claim 9, wherein each of the pair of first source/drain regions comprises a first low concentration source/drain region and a first high concentration source/drain region having a doping concentration higher than that of the first low concentration source/drain region, and
a level of a bottom surface of the first high concentration source/drain region is lower than a level of a bottom surface of the first low concentration source/drain region with respect to a main surface of the substrate.

15. The semiconductor device of claim 9, wherein the channel region in the second region comprises an upper channel region at an upper side of each of the buried insulating patterns and a lower channel region at a lower side of each of the buried insulating patterns, the upper channel region and the lower channel region being separated from each other by each of the buried insulating patterns, and
a doping concentration of the upper channel region is less than that of the lower channel region.

16. The semiconductor device of claim 1, further comprising a pair of insulation spacers on both sidewalls of the gate electrode, wherein opposite ends of a pair of the second source/drain regions of the pair of source/drain regions are located at a lower side of the pair of insulation spacers.

17. The semiconductor device of claim 7, wherein the part of both ends of each of the buried insulating patterns is in contact with an upper portion of the first source/drain region.

18. The semiconductor device of claim 7, wherein each of the buried insulating patterns is spaced apart from the second source/drain region.

19. The semiconductor device of claim 18, wherein a distance between a pair of the second source/drain regions of the pair of source/drain regions is greater than a width of the gate electrode between the pair of source/drain regions.

20. The semiconductor device of claim 18, wherein a distance between a pair of the second source/drain regions of the pair of source/drain regions is greater than a width of each of the buried insulating patterns.

21. A semiconductor device comprising:
a substrate having an active region including a channel region;
a gate insulating layer that covers a top surface of the active region;
a gate electrode that covers the gate insulating layer on the top surface of the active region;
buried insulating patterns in the channel region of the active region at a lower side of the gate electrode and spaced apart from a top surface of the substrate; and
a pair of source/drain regions in the substrate at both sides of each of the buried insulating patterns and extending from the top surface of the substrate to a level lower than that of each of the buried insulating patterns,
wherein all of the buried insulating patterns overlap the gate electrode in a direction perpendicular to a main surface of the substrate, and
a width of each of the buried insulating patterns is smaller than a width of the gate electrode between the pair of source/drain regions.

* * * * *